(12) United States Patent
Khan et al.

(10) Patent No.: US 7,102,225 B2
(45) Date of Patent: Sep. 5, 2006

(54) DIE-UP BALL GRID ARRAY PACKAGE WITH PRINTED CIRCUIT BOARD ATTACHABLE HEAT SPREADER

(75) Inventors: Reza-ur R Khan, Rancho Santa Margarita, CA (US); Sam Z Zhao, Irvine, CA (US); Brent Bacher, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/200,336

(22) Filed: Jul. 23, 2002

(65) Prior Publication Data

US 2002/0185750 A1 Dec. 12, 2002

Related U.S. Application Data

(62) Division of application No. 09/742,366, filed on Dec. 22, 2000.

(51) Int. Cl.
*H01L 23/10* (2006.01)
*H01L 23/34* (2006.01)
*H01L 23/48* (2006.01)
*H01L 23/52* (2006.01)

(52) U.S. Cl. ............... 257/706; 257/713; 257/784; 257/780; 257/E23.101

(58) Field of Classification Search ........... 257/706, 257/712, 713, 784, 780, 738, 787, E23.101
See application file for complete search history.

(56) References Cited

U.S. PATENT DOCUMENTS

| | | |
|---|---|---|
| 3,790,866 A | 2/1974 | Meyer et al. |
| 4,611,238 A | 9/1986 | Lewis et al. |
| 5,045,921 A | 9/1991 | Lin et al. |
| 5,065,281 A | 11/1991 | Hernandez et al. |
| 5,173,766 A | 12/1992 | Long et al. |
| 5,208,504 A | 5/1993 | Parker et al. |

(Continued)

FOREIGN PATENT DOCUMENTS

EP 0 573 297 A2 12/1993

(Continued)

OTHER PUBLICATIONS

U.S. Appl. No. 09/984,259, filed Oct. 29, 2001, Zhao et al.

(Continued)

*Primary Examiner*—Nitin Parekh
(74) *Attorney, Agent, or Firm*—Sterne Kessler Goldstein & Fox, PLLC

(57) ABSTRACT

An electrically and thermally enhanced die-up tape substrate ball grid array (BGA) package and die-up plastic substrate BGA package are described. A substrate that has a first surface and a second surface is provided. The stiffener has a first surface and a second surface. The second stiffener surface is attached to the first substrate surface. An IC die has a first surface and a second surface. The first IC die surface is mounted to the first stiffener surface. A plurality of solder balls is attached to the second substrate surface. In one aspect, a heat spreader is mounted to the second IC die surface. In another aspect, the stiffener is coupled to ground to act as a ground plane. In another aspect, the substrate has a window opening that exposes a portion of the second stiffener surface. The exposed portion of the second stiffener surface is configured to be coupled to a printed circuit board (PCB). In another aspect, a metal ring is attached to the first stiffener surface. In another aspect, wire bond openings in the stiffener are bridged by one or more studs.

25 Claims, 21 Drawing Sheets

U.S. PATENT DOCUMENTS

| | | |
|---|---|---|
| 5,216,278 A | 6/1993 | Lin et al. |
| 5,285,352 A | 2/1994 | Pastore et al. |
| 5,291,062 A | 3/1994 | Higgins et al. |
| 5,294,826 A | 3/1994 | Marcantonio et al. |
| 5,366,589 A | 11/1994 | Chang |
| 5,394,009 A | 2/1995 | Loo |
| 5,397,917 A | 3/1995 | Ommen et al. |
| 5,397,921 A | 3/1995 | Karnezos ............... 257/779 |
| 5,409,865 A | 4/1995 | Karnezos |
| 5,433,631 A | 7/1995 | Beaman et al. |
| 5,438,216 A | 8/1995 | Juskey et al. |
| 5,474,957 A | 12/1995 | Urushima ............... 437/209 |
| 5,490,324 A | 2/1996 | Newman |
| 5,534,467 A | 7/1996 | Rostoker ............... 437/209 |
| 5,552,635 A | 9/1996 | Kim et al. |
| 5,572,405 A | 11/1996 | Wilson et al. |
| 5,578,869 A | 11/1996 | Hoffman et al. |
| 5,583,377 A | 12/1996 | Higgins, III |
| 5,583,378 A | 12/1996 | Marrs et al. |
| 5,642,261 A | 6/1997 | Bond et al. |
| 5,648,679 A | 7/1997 | Chillara et al. |
| 5,650,659 A | 7/1997 | Mostafazadeh et al. |
| 5,650,662 A | 7/1997 | Edwards et al. |
| 5,691,567 A | 11/1997 | Lo et al. |
| 5,717,252 A | 2/1998 | Nakashima et al. |
| 5,736,785 A | 4/1998 | Chiang et al. |
| 5,744,863 A | 4/1998 | Culnane et al. |
| 5,796,170 A | 8/1998 | Marcantonio |
| 5,798,909 A | 8/1998 | Bhatt et al. |
| 5,801,432 A | 9/1998 | Rostoker et al. |
| 5,835,355 A | 11/1998 | Dordi |
| 5,843,808 A | 12/1998 | Karnezos |
| 5,844,168 A | 12/1998 | Schueller et al. |
| 5,856,911 A | 1/1999 | Riley |
| 5,866,949 A | 2/1999 | Schueller |
| 5,883,430 A | 3/1999 | Johnson |
| 5,889,321 A | 3/1999 | Culnane et al. |
| 5,889,324 A | 3/1999 | Suzuki |
| 5,894,410 A | 4/1999 | Barrow |
| 5,895,967 A | 4/1999 | Stearns et al. |
| 5,901,041 A | 5/1999 | Davies et al. |
| 5,903,052 A | 5/1999 | Chen et al. |
| 5,905,633 A | 5/1999 | Shim et al. |
| 5,907,189 A | 5/1999 | Mertol |
| 5,907,903 A | 6/1999 | Ameen et al. |
| 5,920,117 A | 7/1999 | Sono et al. |
| 5,949,137 A | 9/1999 | Domadia et al. |
| 5,953,589 A | 9/1999 | Shim et al. |
| 5,972,734 A | 10/1999 | Carichner et al. |
| 5,976,912 A | 11/1999 | Fukutomi et al. |
| 5,977,626 A | 11/1999 | Wang et al. |
| 5,977,633 A | 11/1999 | Suzuki et al. |
| 5,982,621 A | 11/1999 | Li |
| 5,986,340 A | 11/1999 | Mostafazadeh et al. |
| 5,986,885 A | 11/1999 | Wyland |
| 5,998,241 A | 12/1999 | Niwa |
| 5,999,415 A | 12/1999 | Hamzehdoost |
| 6,002,147 A | 12/1999 | Iovdalsky et al. |
| 6,002,169 A | 12/1999 | Chia et al. |
| 6,011,304 A | 1/2000 | Mertol |
| 6,020,637 A | 2/2000 | Karnezos |
| 6,028,358 A | 2/2000 | Suzuki |
| 6,034,427 A | 3/2000 | Lan et al. |
| 6,040,984 A | 3/2000 | Hirakawa |
| 6,057,601 A | 5/2000 | Lau et al. |
| 6,060,777 A | 5/2000 | Jamieson et al. |
| 6,069,407 A | 5/2000 | Hamzehdoost |
| 6,077,724 A | 6/2000 | Chen |
| 6,084,297 A | 7/2000 | Brooks et al. |
| 6,084,777 A | 7/2000 | Kalidas et al. |
| 6,114,761 A | 9/2000 | Mertol et al. |
| 6,117,797 A | 9/2000 | Hembree |
| 6,122,171 A | 9/2000 | Akram et al. |
| 6,133,064 A | 10/2000 | Nagarajan et al. |
| 6,140,707 A | 10/2000 | Plepys et al. |
| 6,160,705 A | 12/2000 | Stearns et al. |
| 6,162,659 A | 12/2000 | Wu |
| 6,163,458 A | 12/2000 | Li |
| 6,166,434 A | 12/2000 | Desai et al. |
| 6,184,580 B1 | 2/2001 | Lin |
| 6,201,300 B1 | 3/2001 | Tseng et al. |
| 6,207,467 B1 | 3/2001 | Vaiyapuri et al. |
| 6,212,070 B1 | 4/2001 | Atwood et al. |
| 6,242,279 B1 | 6/2001 | Ho et al. |
| 6,246,111 B1 | 6/2001 | Huang et al. |
| 6,278,613 B1 | 8/2001 | Fernandez et al. |
| 6,288,444 B1 | 9/2001 | Abe et al. |
| 6,313,521 B1 | 11/2001 | Baba |
| 6,313,525 B1 | 11/2001 | Sasano |
| 6,347,037 B1 | 2/2002 | Iijima et al. |
| 6,362,525 B1 | 3/2002 | Rahim |
| 6,365,980 B1 * | 4/2002 | Carter et al. ............... 257/787 |
| 6,369,455 B1 | 4/2002 | Ho et al. |
| 6,380,623 B1 | 4/2002 | Demore |
| 6,462,274 B1 | 10/2002 | Shim et al. |
| 6,472,741 B1 | 10/2002 | Chen et al. |
| 6,525,942 B1 | 2/2003 | Huang et al. |
| 6,528,869 B1 | 3/2003 | Glenn et al. |
| 6,528,892 B1 | 3/2003 | Caletka et al. |
| 6,541,832 B1 | 4/2003 | Coyle |
| 6,552,266 B1 | 4/2003 | Carden et al. |
| 6,552,428 B1 | 4/2003 | Huang et al. |
| 6,552,430 B1 | 4/2003 | Perez et al. |
| 6,614,660 B1 | 9/2003 | Bai et al. |
| 6,617,193 B1 | 9/2003 | Toshio et al. |
| 6,657,870 B1 | 12/2003 | Ali et al. |
| 6,664,617 B1 | 12/2003 | Siu |
| 6,724,071 B1 | 4/2004 | Combs |
| 6,724,080 B1 | 4/2004 | Ooi et al. |
| 2001/0001505 A1 | 5/2001 | Schueller et al. |
| 2001/0040279 A1 | 11/2001 | Mess et al. |
| 2001/0045644 A1 | 11/2001 | Huang |
| 2002/0053731 A1 | 5/2002 | Chao et al. |
| 2002/0072214 A1 | 6/2002 | Yuzawa et al. |
| 2002/0096767 A1 | 7/2002 | Cote et al. |
| 2002/0098617 A1 | 7/2002 | Lee et al. |
| 2002/0171144 A1 | 11/2002 | Zhang et al. |
| 2002/0180040 A1 | 12/2002 | Camenforte et al. |
| 2002/0185717 A1 | 12/2002 | Eghan et al. |
| 2003/0138613 A1 | 7/2003 | Thoman et al. |
| 2004/0072456 A1 | 4/2004 | Dozier, II et al. |

FOREIGN PATENT DOCUMENTS

| | | |
|---|---|---|
| EP | 0 504 411 B1 | 6/1998 |
| FR | 2 803 098 A3 | 6/2001 |
| JP | 81-49446 | 3/1986 |
| JP | 7-283336 | 10/1995 |
| JP | 10-50877 | 2/1998 |
| JP | 10-189835 | 7/1998 |
| JP | 10-247702 | 9/1998 |
| JP | 10-247703 | 9/1998 |
| JP | 11-17064 | 1/1999 |
| JP | 11-102989 | 4/1999 |
| JP | 2000-286294 | 10/2000 |
| JP | 2001-68512 | 3/2001 |
| TW | 383908 | 3/2000 |
| TW | 417219 | 1/2001 |

OTHER PUBLICATIONS

U.S. Appl. No. 09/997,272, filed Nov. 30, 2001, Zhao et al.
Ahn, S.H. and Kwon, Y.S., "Popcorn Phenomena in a Ball Grid Array Package", IEEE Transactions on Components, Packaging, and Manufactuing Technology Part B: Advanced Packaging, IEEE, Aug. 1995, vol. 18, No. 3, pp. 491-496.

Amkor Electronics, "Amkor BGA Packagiing: Taking The World By Storm", Electronic Packaging & Production, Cahners Publishing Company, May 1994, page unknown.

Anderson, L. and Trabucco, B., "Solder Attachment Analysis of Plastic BGA Modules", Surface Mount International Conference, Surface Mount International, Aug. 28-Sep. 1, 1994, San Jose, California, pp. 189-194.

Andrews, M., "Trends in Ball Grid Array Technology," Ball Grid Array National Symposium, Mar. 29-30, 1995, Dallas, Texas, 10 pages.

Attarwala, A.I. Dr. and Stierman, R., "Failure Mode Analysis of a 540 Pin Plastic Ball Grid Array", Surface Mount International Conference, Surface Mount International, Aug. 28-Sep. 1, 1994, San Jose, California, pp. 252-257.

Banerji, K., Development of the Slightly Larger Than IC Carrier (SLICC), Journal of Surface Mount Technology, Jul. 1994, pp. 21-26.

Bauer, C., Ph.D., "Partitioning and Die Selection Strategies for Cost Effective MCM Designs", Journal of Surface Mount Technology, Oct. 1994, pp. 4-9.

Bernier, W.E. et al., "BGA vs. QFP: A Summary of Tradeoffs for Selection of High I/O Components", Surface Mount International Conference Proceedings, Surface Mount International, Aug. 28-Sep. 1, 1994, San Jose, California, pp. 181-185.

Burgos, J. et al., "Achieving Accurate Thermal Characterization Using a CFD Code—A Case Study of Plastic Packages", IEEE Transactions on Components, Packaging, and Manufacturing Technology Part A, IEEE, Dec. 1995, vol. 18, No. 4, pp. 732-738.

Chadima, M., "Interconnecting Structure Manufacturing Technology," Ball Grid Array National Symposium, Dallas, Texas, Mar. 29-30, 1995.

Chanchani, R. et al., "Mini BGA: Pad and Pitch Ease Die Test and Handling", Advanced Packaging, IHS Published Group, May/Jun. 1995, pp. 34, 36-37.

Chung, T.C. et al., "Rework of Plastic, Ceramic, and Tape Ball Grid Array Assemblies", Ball Grid Array National Symposium Proceedings, Dallas, Texas, Mar. 29-30, 1995, pp. 1-15.

Cole, M.S. and Caulfield, T. "A Review of Available Ball Grid Array (BGA) Packages", Journal of Surface Mount Technology, Surface Mount Technology Association, Jan. 1996, vol. 9, pp. 4-11.

Cole, M.S. and Caulfield, T., "Ball Grid Array Packaging", Surface Mount International Conference Proceedings, Surface Mount International, Aug. 28-Sep. 1, 1994, San Jose, California, pp. 147-153.

Dobers, M. and Seyffert, M., "Low Cost MCMs: BGAs Provide a Fine-Pitch Alternative", Advanced Packaging, IHS Publishing Group, Sep./Oct. 1994, vol. 3, No. 5, pp. 28, 30 and 32.

Doby, G. and Burnette, T., "BGA Assembly Process and Rework", Journal of Surface Mount Technology, Surface Mount Technology Association, Jan. 1996, vol. 9, pp. 39-45.

Edwards, D. et al., "The Effect of Internal Package Delaminations on the Thermal Performance of PQFP, Thermally Enhanced PQFP, LOC and BGA Packages", 45th Electronic Components & Technology Conference, IEEE, May 21-24, 1995, Las Vegas, NV, pp. 285-292.

Ejim, T.L. et al., "Designed Experiment to Determine Attachment Reliability Drivers for PBGA Packages", Journal of Surface Mount Technology, Surface Mount Technology Association, Jan. 1996, vol. 9, pp. 30-38.

Ewanich, J. et al., "Development of a Tab (TCP) Ball Grid Array Package", Proceedings of the 1995 International Electronics Packaging Conference, San Diego, CA, Sep. 24-27, 1995, pp. 588-594.

Fauser, S. et al, "High Pin-Count PBGA Assembly", Circuits Assembly, Feb. 1995, vol. 6, No. 2, pp. 36-38 and 40.

Fauser, Suzanne et al., "High Pin Count PBGA Assembly: Solder Defect Failure Modes and Root Cause Analysis", Surface Mount International, Proceedings of The Technical Program, Surface Mount International, Aug. 28-Sep. 1, 1994, San Jose, California, pp. 169-174.

Ferguson, M. "Ensuring High-Yield BGA Assembly", Circuits Assembly, Feb. 1995, vol. 6, No. 2, pp. 54, 56 and 58.

Freda, M., "Laminate Technology for IC Packaging", Electronic Packaging & Production, Cahners Publishing Company, Oct. 1995, vol. 35, No. 11, pp. S4-S5.

Freedman, M., "Package Size and Pin-Out Standardization", Ball Grid Array National Symposium, Mar. 29-30, 1995, 7 pages.

Freyman, B. and Pennisi, R., "Over-molded Plastic Pad Array Carriers (OMPAC): A Low Cost, High Interconnect Density IC Packaging Solution for Consumer and Industrial Electronics", 41st Electronic Components & Technology Conference, IEEE, May 11-16, 1991, pp. 176-182.

Freyman, B. et al., "Surface Mount Process Technology for Ball Grid Array Packaging", Surface Mount International Conference Proceedings, Surface Mount International, Aug. 29-Sep. 2, 1993, San Jose, California, pp. 81-85.

Freyman, B. et al., "The Move to Perimeter Plastic BGAs", Surface Mount International Conference Proceedings, San Jose, CA, Aug. 29-31, 1995, pp. 373-382.

Freyman, B., "Trends in Plastic BGA Packaging," Ball Grid Array National Symposium, Dallas, Texas, Mar. 29-30, 1995, 45 pages.

Gilleo, K., "Electronic Polymers: Die Attach and Oriented Z-Axis Films", Advanced Packaging, IHS Publishing Group, Sep./Oct. 1994, vol. 3, No. 5, pp. 37-38, 40 and 42.

Guenin, B. et al., "Analysis of a Thermally Enhanced Ball Grid Array Package", IEEE Transactions on Components, Packaging, and Manufacturing Technology, Part A, IEEE Components, Packaging, and Manufacturing Technology Society, Dec. 1995, vol. 18, No. 4, pp. 749-757.

Hart, C., "Vias in Pads for Coarse and Fine Pitch Ball Grid Arrays", Surface Mount International Conference Proceedings, Surface Mount International, Aug. 28-Sep. 1, 1994, San Jose, California, pp. 203-207.

Hart, C. "Vias in Pads", Circuits Assembly, Feb. 1995, vol. 6, No. 2, pp. 42, 44-46 and 50.

Hattas, D., "BGAs Face Production Testing: New Package Offers Promise but Must Clear Technology Hurdles.", Advanced Packaging, IHS Publishing Group, Summer 1993, vol. 2, No. 3, pp. 44-46.

Heitmann, R., "A Direct Attach Evolution: TAB, COB and Flip Chip Assembly Challenges", Advanced Packaging, IHS Publishing Group, Jul./Aug. 1994, vol. 3, No. 4, pp. 95-99 and 103.

Hodson, T., "Study Examines BGA Use", Electronic Packaging & Production, Mar. 1993, page unknown.

Holden, H., "The Many Techniques of Small Via Formation for Thin Boards", The Institute for Interconnecting and Packaging Electronic Circuits Ball Grid Array National Symposium, San Diego, CA, Jan. 18-19, 1996, pp. 1-7.

Houghten, J., "New Package Takes On QFPs", Advanced Packaging, IHS Publishing Group, Winter 1993, vol. 2, No. 1, pp. 38-39.

"How To Give Your BGAs A Better Bottom Line.", Advanced Packaging, IHS Publishing Group, Jan./Feb. 1995, page unknown.

Huang, W. and Ricks, J.,"Electrical Characterization of PBGA for Communication Applications by Simulation and Measurement", National Electronic Packaging and Production Conference West '95, Feb. 26-Mar. 2, 1995, Anaheim, California, pp. 300-307.

Hundt, M. et al., "Thermal Enhancements of Ball Grid Arrays", National Electronic Packaging and Production Conference West '95, Reed Exhibition Companies, Anaheim, CA, Feb. 25-29, 1996, pp. 702-711.

Hutchins, C.L., "Understanding Grid Array Packages", Surface Mount Technology Magazine, IHS Publishing Group, Nov. 1994, vol. 8, No. 11, pp. 12-13.

Hwang, J.S., "Reliability of BGA Solder Interconnections", Surface Mount Technology Magazine, IHS Publishing Group, Sep. 1994, vol. 8, No. 9, pp. 14-15.

Hwang, J.S., "A Hybrid of QFP and BGA Architectures", Surface Mount Technology Magazine, IHS Publishing Group, Feb. 1995, vol. 9, No. 2, p. 18.

Johnson, R. et al., "A Feasibility Study of of Ball Grid Array Packaging", National Electronic Packaging and Production Conference East '93, Boston, Massachusetts, Jun. 14-17, 1993, pp. 413-422.

Johnson, R. et al., "Thermal Characterization of 140 and 225 Pin Ball Grid Array Packages", National Electronic Packaging & Production Conference East '93, Boston, Massachusetts, Jun. 14-17, 1993, pp. 423-430.

Johnston, P., "Land Pattern Interconnectivity Schemes", Ball Grid Array National Symposium, Dallas, Texas, Mar. 29-30, 1995, pp. 2-21.

Johnston, P. "Printed Circuit Board Design Guidelines for Ball Grid Array Packages", Journal of Surface Mount Technology, Surface Mount Technology Association, Jan. 1996, vol. 9, pp. 12-18.

Kawahara, T. et al., "Ball Grid Array Type Package By Using of New Encapsulation Method", Proceedings of the 1995 International Electronics Packaging Conference, San Diego, CA, Sep. 24-27, 1995, pp. 577-587.

Knickerbocker, J.U. and Cole, M.S., "Ceramic BGA: A Packaging Alternative", Advanced Packaging, IHS Publishing Group, Jan./Feb. 1995, vol. 4, No. 1, pp. 20, 22 and 25.

Kromann, G., et al., "A Hi-Density C4/CBGA Interconnect Technology for a CMOS Microprocessor", National Electronic Packaging and Production Conference West '95, IEEE, Feb. 26-Mar. 2, 1995, Anaheim, California, pp. 1523-1529.

Kunkle, R., "Discrete Wiring for Array Packages", Ball Grid Array National Symposium, Dallas, Texas, Mar. 29-30, 1995, 9 pages.

Lall, B. et al., "Methodology for Thermal Evaluation of Multichip Modules", IEEE Transactions on Components, Packaging, and Manufacturing Technology Part A, IEEE, Dec. 1995, vol. 18, No. 4, pp. 758-764.

Lasance, C. et al., "Thermal Characterization of Electronic Devices with Boundary Condition Independent Compact Models", IEEE Transactions on Components, Packaging, and Manufacturing Technology Part A, IEEE Components, Packaging, and Manufacturing Technology Society, Dec. 1995, vol. 18, No. 4, pp. 723-731.

Lau, J., "Ball Grid Array Technology", McGraw-Hill Inc., 1995, entire book submitted.

Lau, J. et al., "No Clean Mass Reflow of Large Plastic Ball Grid Array Packages", Circuit World, Wela Publications Ltd., vol. 20, No. 3, Mar. 1994, pp. 15-22.

"Literature Review", Special Supplement to Electronic Packaging & Production, Feb. 1995, Cahners Publication, 10 pages.

LSI LOGIC Package Selector Guide, Second Edition, LSI Logic Corporation, 1994-1995, entire document submitted.

"LTCC MCMs Lead to Ceramic BGAs," Advanced Packaging, IHS Publishing Group, Sep./Oct. 1994, vol. 3, No. 5, pp. 14-15.

Mak, Dr. W.C. et al., "Increased SOIC Power Dissipation Capability Through Board Design and Finite Element Modeling", Journal of Surface Mount Technology, Surface Mount International, Oct. 1994, pp. 33-41.

Marrs, R.C. and Olachea, G., "BGAs For MCMs: Changing Markets and Product Functionality", Advanced Packaging, IHS Publishing Group, Sep./Oct. 1994, vol. 3, No. 5, pp. 48, 50, and 52.

Matthew, L.C. et al., "Area Array Packaging: KGD in a Chip-Sized Package", Advanced Packaging, IHS Publishing Group, Jul./Aug. 1994, pp. 91-94.

Mawer, A. et al., "Plastic BGA Solder Joint Reliability Considerations", Surface Mount International Conference Proceedings, Surface Mount International, Aug. 28-Sep. 1, 1994, San Jose, California, pp. 239-251.

Mazzullo, T. and Schaertl, L., "How IC Packages Affect PCB Design", Surface Mount Technology Magazine, Feb. 1995, vol. 9, No. 2, pp. 114-116.

Mearig, J., "An Overview of Manufacturing BGA Technology", National Electronic Packaging and Production Conference West '95, Feb. 26-Mar. 2, 1995, Anaheim, California, pp. 295-299.

Mertol, A., "Application of the Taguchi Method on the Robust Design of Molded 225 Plastic Ball Grid Array Packages", IEEE Transactions on Components, Packaging, and Manufacturing Technology Part B: Advanced Packaging, IEEE, Nov. 1995, vol. 18, No. 4, pp. 734-743.

Mescher, P. and Phelan, G., "A Practical Comparison of Surface Mount Assembly for Ball Grid Array Components", Surface Mount International Conference Proceedings, Surface Mount International, Aug. 28-Sep. 1, 1994, San Jose, California, pp. 164-168.

Mulgaonker, S. et al., "An Assessment of the Thermal Performance of the PBGA Family", Eleventh Annual IEEE Semiconductor Thermal Measurement and Management Symposium, IEEE, San Jose, CA, Feb. 7-9, 1995,pp. 17-27.

"New PBGA Pushes Technology to Outer Limits", Advanced Packaging, IHS Publishing Group, Jan./Feb. 1995, p. 11.

Olachea, G., "Managing Heat: A Focus on Power IC Packaging", Electronic Packaging & Production (Special Supplement), Cahners Publishing Company, Nov. 1994, pp. 26-28.

"Pad Array Improves Density", Electronic Packaging & Production, Cahners Publishing Company, May 1992, pp. 25-26.

Partridge, J. and Viswanadham, P., "Organic Carrier Requirements for Flip Chip Assemblies", Journal of Surface Mount Technology, Surface Mount Technology Association, Jul. 1994, pp. 15-20.

Ramirez, C. and Fauser, S., "Fatigue Life Comparison of The Perimeter and Full Plastic Ball Grid Array", Surface Mount International Conference Proceedings, Surface Mount International, Aug. 28-Sep. 1, 1994, San Jose, California, pp. 258-266.

Rogren, P., "MCM-L Built on Ball Grid Array Formats", National Electronic Packaging and Production Conference West '94, Anaheim, California, pp. 1277-1282.

Rooks, S., "X-Ray Inspection of Flip Chip Attach Using Digital Tomosynthesis", Surface Mount International, Proceedings of The Technical Program, Aug. 28-Sep. 1, 1994, San Jose, California, pp. 195-202.

Rukavina, J., "Attachment Methodologies: Ball Grid Array Technology", Ball Grid Array National Symposium, Dallas, Texas, Mar. 29-30, 1995, 37 pages.

Sack, T., "Inspection Technology", Ball Grid Array National Symposium, Dallas, Texas, Mar. 29-30, 1995, pp. 1-41.

Sakaguchi, H., "BGA MountingTechnology," pp. 1-4, date and source unknown.

Schmolze, C. and Fraser, A., "SPICE Modeling Helps Enhance BGA Performance", Electronic Packaging & Production, Jan. 1995, pp. 50-52.

Semiconductor Group Package Outlines Reference Guide, Texas Instruments, 1995, entire document submitted.

Shimizu, J., "Plastic Ball Grid Array Coplanrity", Surface Mount International Conference, San Jose, California, Aug. 31-Sep. 2, 1993, pp. 86-91.

Sigliano, R., "Using BGA Packages: An Appealing Technology in a QFP and Fine-Pitch Market", Advanced Packaging, IHS Publishing Group, Mar./Apr. 1994, pp. 36-39.

Sirois, L., "Dispensing for BGA: Automated Liquid Dispensing in a High-Density Environment", Advanced Packaging, IHS Publishing Group, May/Jun. 1995, pp. 38 and 41.

Solberg, V., "Interconnection Structure Preparation: Impact of Material Handling and PCB Surface Finish on SMT Assembly Process Yield", Ball Grid Array National Symposium, Dallas, Texas, Mar. 29-30, 1995, 10 pages.

"Survival of the Fittest", Advanced Packaging, IHS Publishing Group, Mar./Apr. 1995, page unknown.

Tuck, J., "BGA Technology Branches Out", Circuits Assembly, Feb. 1995, vol. 6, No. 2, pp. 24, 26, and 28.

"Tutorial and Short Courses", 45th Electronic Components & Technology Conference, May 21-24, 1995, Las Vegas, Nevada, IEEE, 6 pages.

Vardaman, E. J. and Crowley, R.T., "Worldwide Trends In Ball Grid Array Developments", National Electronic Packaging and Production Conference West '96, Reed Exhibition Companies, Anaheim, CA, Feb. 25-29, 1996, pp. 699-701.

Walshak, D. and Hashemi, H., "Thermal Modeling of a Multichip BGA Package", National Electronic Packaging and Production Conference West '94, Reed Exhibition Companies, Anaheim, California, Feb. 27-Mar. 4, 1994, pp. 1266-1276.

Walshak, D. and Hashemi, H., "BGA Technology: Current and Future Direction for Plastic, Ceramic and Tape BGAs", Surface Mount International Conference Proceedings, Surface Mount International, Aug. 28-Sep. 1, 1994, San Jose, California, pp. 157-163.

Xie, H. et al., "Thermal Solutions to Pentium Processors in TCP in Notebooks and Sub-Notebooks", 45th Electronic Components & Technology Conference, IEEE, Las Vegas, NV, May 21-24, 1995, pp. 201-210.

Yip, W.Y., "Package Characterization of a 313 Pin BGA", National Electronic Packaging and Production Conference West '95, Reed Exhibition Companies, Feb. 26-Mar. 2, 1995, Anaheim, California, pp. 1530-1541.

Zamborsky, E., "BGAs in the Assembly Process", Circuits Assembly, Feb. 1995, vol. 6, No. 2, pp. 60, 62-64.

Zimerman, M., "High Performance BGA Molded Packages for MCM Application", Surface Mount International Conference Proceedings, Surface Mount International, Aug. 28-Sep. 1, 1994, San Jose, California, pp. 175-180.

Zweig, G., "BGAs: Inspect the Process, Not the Product", Electronic Packaging & Production (Special Supplement), Cahners Publishing Company, Aug. 1994 (Supplement), p. 41.

Houghten, J.L., "Plastic Ball-Grid Arrays Continue To Evolve", Electronic Design, Feb. 6, 1995, pp. 141-146.

Marrs, R. et al., "Recent Technology Breakthroughs Achieved with the New *Super*BGA® Package", 1995 International Electronics Packaging Conference, San Diego, California, Sep. 24-27, 1995, pp. 565-576.

Hayden, T.F. et al., "Thermal & Electrical Performance and Reliability Results for Cavity-Up Enhanced BGAs", Electronic Components and Technology Conference, IEEE,1999, pp. 638-644.

Thompson, T., "Reliability Assessment of a Thin (Flex) BGA Using a Polyimide Tape Substrate", International Electronics Manufacturing Technology Symposium, IEEE, 1999, pp. 207-213.

Amkor package data sheet, "SuperFC®", from http://www.amkor.com/Products/all_datasheets/superfc.pdf, 2 pages (Jan. 2003).

Andros, F., "Tape Ball Grid Array," from Puttlitz, K.J. and Totta, P.A. (eds.), *Area Array Interconnection Handbook*, pp. 619-620, ISBN No. 0-7923-7919-5, Kluwer Academic Publishers (2001).

Brofman, P.J. et al., "Flip-Chip Die Attach Technology," Puttlitz, K.J. and Totta, P.A. (eds.), *Area Array Interconnection Handbook*, pp. 315-349, ISBN No. 0-7923-7919-5, Kluwer Academic Publishers (2001).

Freyman, B. and Petrucci, M., "High-Pincount PBGAs," *Advanced Packaging*, pp. 44-46, An IHS Group Publication (May/Jun. 1995).

Ghosal, B. et al., "Ceramic and Plastic Pin Grid Array Technology," Puttlitz, K.J. and Totta, P.A. (eds.), *Area Array Interconnection Handbbok*, pp. 551-576, ISBN No. 0-7923-7919-5, Kluwer Academic Publishers (2001).

Harper, C.A. (ed.), *Electronic Packaging And Interconnection Handbook*, Third Edition, pp. 7.58-7.59, ISBN No. 0-07-134745-3, McGraw-Hill Companies (2000).

Lin, S. and Chang, N., "Challenges in Power-Ground Integrity," *Proceedings Of The 2001 International Conference On Computer-Aided Design*, pp. 651-654 (Nov. 4-8, 2001).

Lloyd, J. and Overhauser, D., "Electromigration wreaks havoc on IC design," *EDN*, pp. 145-148 (Mar. 26, 1998).

Song, W.S. and Glasser, L.A., "Power Distribution Techniques for VLSI Circuits," *IEEE Journal Of Solid-State Circuits*, vol. SC-21, No. 1, pp. 150-156 (Feb. 1986).

Tang, K.T. and Friedman, E.G., "Simultaneous Switching Noise in On-Chip CMOS Power Distribution Networks," *IEEE TRansactions On Very Large Scale Integration (VLSI) Systems*, vol. 10, No. 4, pp. 487-493 (Aug. 2002).

Zhao, S. et al., U.S. Appl. No. 10/870,927, filed Jun. 21, 2004, entitled "Apparatus and Method for Thermal and Electromagnetic Interference (EMI) Shielding Enhancement in Die-up Array Packages".

Khan, R. et al., U.S. Appl. No. 10/952,172, filed Sep. 29, 2004, entitled "Die Down Ball Grid Array Packages and Method for Making Same".

English Abstract for French Patent Publication No. FR2803098, 1 page, from http://v3.espacenet.com.

Copy of Written Primary Examination Decision of Rejection issued by the Taiwan Patent Office (with English translation attached) 5 pages.

Schueller, R.D. et al., "Performance and Reliability of a Cavity Down Tape BGA Package," *IEEE Electronic Packaging Technology Conference*, 1997, pp. 151-162.

English-language Abstract of JP 10-189835, published Jul. 21, 1998, 2 pages (last visited Mar. 14, 2003).

English-language Abstract of JP 10-247703, published Sep. 14, 1998, 1 page.

English-language Abstract of JP 2000-286294, published Oct. 13, 2000, 2 pages (last visited Mar. 14, 2003).

English-language Abstract of JP 2001-68512, published Mar. 16, 2001, 1 page (last visited Oct. 2, 2002).

English-language Abstract of JP 10-247702, published Sep. 14, 1998, 2 pages (last visited Jan. 25, 2002).

English-language Abstract of JP 10-50877, published Feb. 20, 1998, 1 page (last visited Oct. 2, 2002).

English-language Abstract of JP 11-17064, published Jan. 22, 1999, 1 page.

English-language Abstract of JP 11-102989, published Apr. 13, 1999, 1 page.

English-language Abstract of JP 7-283336, published Oct. 27, 1995, 1 page.

English-language Abstract of JP 61-49446, published Mar. 11, 1986, 1 page.

Karnezos, M. , "An EPBGA Alternative," *Advanced Packaging*, Jun. 1998, pp. 90, 92, 94, and 96.

Zhao, Z., Ph.D., "Thermal Design and Modeling of Packages," *IEEE Short Courses*, Broadcom Corporation, Oct. 25, 2000, 95 pages.

Zhao, Z., Ph.D., "IC Package Thermal Issues and Thermal Design," ASAT, Inc., Jan. 15, 2000, 98 pages, presented at 2nd International Icepak User's Group Meeting, Palo Alto, CA, on Feb. 7, 2000.

Copy of International Search Report for Appln. No. PCT/US01/44952, issued Jan. 22, 2003.

U.S. Appl. No. 09/783,034, filed Feb. 15, 2001, Khan et al.
U.S. Appl. No. 09/849,537, filed May 7, 2001, Zhang et al.
U.S. Appl. No. 10/020,207, filed Dec. 18, 2001, Khan et al.
U.S. Appl. No. 09/742,366, filed Dec. 22, 2000, Khan et al.
U.S. Appl. No. 10/284,312, filed Oct. 31, 2002, Zhao et al.
U.S. Appl. No. 10/284,340, filed Oct. 31, 2002, Zhao et al.
U.S. Appl. No. 10/201,891, filed Jul. 25, 2002, Zhao et al.
U.S. Appl. No. 10/197,438, filed Jul. 18, 2002, Zhao et al.
U.S. Appl. No. 10/201,309, filed Jul. 24, 2002, Zhao et al.
U.S. Appl. No. 10/201,893, filed Jul. 25, 2002, Zhao et al.
U.S. Appl. No. 10/200,255, filed Jul. 23, 2002, Zhao et al.
U.S. Appl. No. 10/101,751, filed Mar. 21, 2002, Zhao et al.
U.S. Appl. No. 10/253,600, filed Sep. 25, 2002, Zhong et al.
U.S. Appl. No. 10/284,371, filed Oct. 31, 2002, Khan et al.
U.S. Appl. No. 10/284,349, filed Oct. 31, 2002, Khan et al.
U.S. Appl. No. 10/284,166, filed Oct. 31, 2002, Zhao et al.
U.S. Appl. No. 10/284,366, filed Oct. 31, 2002, Zhao et al.

* cited by examiner stiffener temperature distribution

DIE-UP BALL GRID ARRAY PACKAGE WITH PRINTED CIRCUIT BOARD ATTACHABLE HEAT SPREADER

CROSS-REFERENCE TO RELATED APPLICATION

This application is a divisional of application Ser. No. 09/742,366, filed Dec. 22, 2000, which is incorporated herein by reference in its entirety.

BACKGROUND OF THE INVENTION

1. Field of the Invention

The invention relates generally to the field of integrated circuit (IC) device packaging technology, and more particularly to substrate stiffening and heat spreading techniques in ball grid array (BGA) packages.

2. Related Art

Integrated circuit (IC) dies are typically mounted in or on a package that is attached to a printed circuit board (PCB). One such type of IC die package is a ball grid array (BGA) package. BGA packages provide for smaller footprints than many other package solutions available today. A BGA package has an array of solder balls located on a bottom external surface of a package substrate. The solder balls are reflowed to attach the package to the PCB. The IC die is mounted to a top surface of the package substrate. Wire bonds typically couple signals in the IC die to the substrate. The substrate has internal routing which electrically couples the IC die signals to the solder balls on the bottom substrate surface.

A number of BGA package substrate types exist, including ceramic, plastic, and tape (also known as "flex"). In some BGA package types, a stiffener may be attached to the substrate to supply planarity and rigidity to the package. In such packages, the IC die may be mounted to the stiffener instead of the substrate. Openings in the stiffener may be used to allow the IC die to be wire-bonded to the substrate.

Die-up and die-down BGA package configurations exist. In die-up BGA packages, the IC die is mounted on a top surface of the substrate or stiffener, opposite of the side to which the solder balls are attached. In die-down BGA packages, the IC die is mounted on a bottom surface of the substrate or stiffener, on the same side as which the solder balls are attached.

Conventional BGA packages are subject to high thermal stresses that result from the heat given off during operation of the mounted IC die. The thermal stresses are primarily imposed on the IC die and solder balls due to the mismatch of the thermal expansion coefficient (CTE) between the semiconductor die and the metal stiffener. As a result, conventional flex BGA packages have difficulty in meeting reliability requirements for die sizes larger than 9 mm. See, e.g., Thompson, T., et al., *Reliability Assessment of a Thin (Flex) BGA Using a Polyimide Tape Substrate*, International Electronics Manufacturing Technology Symposium, IEEE, pp. 207–213 (1999).

The tape substrate used in flex BGA packages is typically polyimide, which has very low values of thermal conductivity. Consequently, the IC die is separated from the PCB internally by the tape substrate thermal barrier. The lack of direct thermal connection from IC die to PCB leads to relatively high resistance to heat transfer from IC die-to-board (theta-jb).

A stiffener attached to a substrate enhances heat spreading. However, the openings on the stiffener for wire bond connections tend to reduce the thermal connections between the IC die and the edges of the stiffener. As a result, heat spreading is limited largely to the region of the IC die attach pad, while areas at the stiffener peripheral do not contribute effectively to heat spreading.

Furthermore, because of the high density of the substrate routing circuitry, it is difficult to bond each power and ground pad on the IC die to the substrate by a corresponding bond finger. As a result, the distribution of ground and power signals connecting to the IC die is frequently compromised in conventional BGA packages.

Ball grid array packages that use plastic substrates (for example, BT or FR4 plastic) are commonly known as plastic BGAs, or PBGAs. See, e.g., Lau, J. H., *Ball Grid Array Technology*, McGraw-Hill, New York, (1995). A PBGA package, for example, may add solder balls to the bottom substrate surface under the IC die to aid in conducting heat to the PCB. Solder balls such as these are referred to as thermal balls. The cost of the PBGA package, however, will increase with the number of thermal balls. Furthermore, a large array of thermal balls may be necessary for heat dissipation into the PCB for high levels of IC device power.

Hence, what is needed are BGA packages with improved heat spreading capabilities, while also providing for high levels of IC electrical performance.

SUMMARY OF THE INVENTION

Ball grid array (BGA) packages having enhanced electrical and thermal characteristics are described herein. The BGA package has a substrate that has a first surface and a second surface. A stiffener has a first surface and a second surface. The second stiffener surface is attached to the first substrate surface. An IC die has a first surface and a second surface. The first IC die surface is mounted to the first stiffener surface. A plurality of solder balls are attached to the second substrate surface.

In a first aspect of the present invention, a heat spreader has a first surface. The first heat spreader surface is mounted to the second IC die surface.

In a further aspect of the present invention, the second IC die surface includes a contact pad. A wire bond corresponding to the contact pad couples the corresponding contact pad to the second stiffener surface. At least one power/ground/thermal solder ball is attached to the second substrate surface. Each of the power/ground/thermal solder balls are coupled to the stiffener through a corresponding via extending through the substrate. The at least one power/ground/thermal solder ball is coupled to a first potential.

In a further aspect of the present invention, the substrate has a window opening that exposes a portion of the second stiffener surface. The exposed portion of the second stiffener surface is configured to be coupled to a printed circuit board (PCB).

In a further aspect of the present invention, a metal ring is attached to the first stiffener surface.

In a further aspect of the present invention, a wire bond opening is positioned along an edge of the IC die mount location. The wire bond opening extends through the stiffener. At least one stud corresponds to the wire bond opening. Each stud bridges the substrate across the corresponding the wire bond opening.

In a further aspect of the present invention, BGA packages having enhanced electrical and thermal characteristics are described herein. A substrate has a first surface and a second surface. The second substrate surface includes an array of contact pads. The first substrate surface is configured to mount an integrated circuit (IC) die. A plurality of solder balls is attached to the contact pads of the substrate. A heat spreader has a first surface coupled to the second substrate surface. A second surface of the heat spreader is configured to be coupled to a printed circuit board (PCB).

Further aspects of the present invention, and further features and benefits thereof, are described below. The accompanying drawings, which are incorporated herein and form a part of the specification, illustrate the present invention and, together with the description, further serve to explain the principles of the invention and to enable a person skilled in the pertinent art to make and use the invention.

BRIEF DESCRIPTION OF THE FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1A:
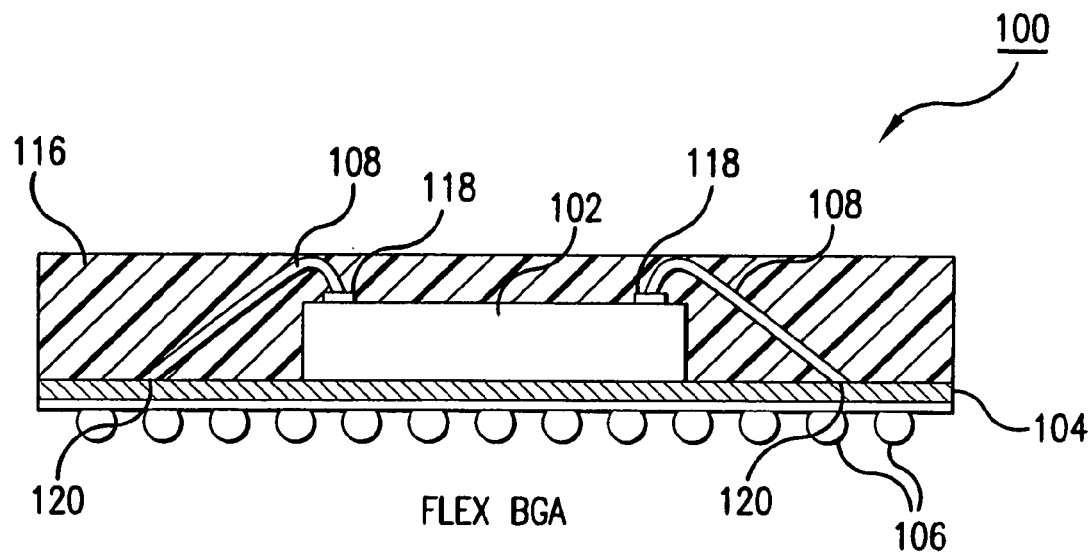
FIGS. 1A and 1B illustrate conventional flex BGA packages.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE PREFERRED EMBODIMENTS

Overview

The present invention is directed to a method and system for improving the mechanical, thermal, and electrical performance of BGA packages. The present invention is applicable to all types of BGA substrates, including ceramic, plastic, and tape (flex) BGA packages. Furthermore the present invention is applicable to die-up (cavity-up) and die-down (cavity-down) orientations.

Numerous embodiments of the present invention are presented herein. In a first embodiment, BGA package thermal stress at the IC die/stiffener interface is released or altered with the introduction of a heat spreader on the top surface of the IC die, enabling large size dies with high input and output (I/O) counts to be packaged using BGA technology. In a second embodiment, BGA package thermal resistance and the length of the current return path are reduced by introducing thermal/ground balls underneath or within close proximity of the IC die. In a third embodiment, the package thermal resistance and ground inductance are reduced by removing center solder balls, and enabling the attachment of a die pad to the PCB. The die pad is attached to the PCB with novel patternings of the metal stiffener, or by positioning a thermal/ground connector in between the IC die pad and the PCB. In a fourth embodiment, the package thermal resistance is reduced by attaching a metal ring to the top surface of a stiffener. In a fifth embodiment, the package thermal resistance is reduced by bridging the die pad to the outer regions of the stiffener with metal studs.

In further embodiments according to the present invention, the electrical performance of the BGA package is improved. In a sixth embodiment, electrical performance is improved by connecting ground bonds from the IC die to the stiffener. In such a configuration, the stiffener operates as a package ground plane. The package ground plane may be connected to PCB ground through either thermal/ground balls or thermal/ground connectors mentioned in embodiments above, and further described herein. In a seventh embodiment, package power distribution is enhanced by using a layer in a tape substrate as a power or ground plane.

In still further embodiments according to the present invention, plastic ball grid array (PBGA) package thermal and electrical performances are improved. In an eighth embodiment, replacing the center solder balls with a solid conductor reduces the package junction-to-board thermal resistance and package ground inductance of a PBGA package.

Ball grid array package types are described below. Further detail on the above described embodiments, and additional embodiments according to the present invention, are presented below. The embodiments described herein may be combined in any applicable manner, as required by a particular application.

Ball Grid Array (BGA) Package

A ball grid array (BGA) package is used to package and interface an IC die with a printed circuit board (PCB). BGA packages may be used with any type of IC die, and are particularly useful for high speed ICs. In a BGA package, solder pads do not just surround the package periphery, as in chip carrier type packages, but cover the entire bottom package surface in an array configuration. BGA packages are also referred to as pad array carrier (PAC), pad array, land grid array, and pad-grid array packages. BGA packages types are further described in the following paragraphs. For additional description on BGA packages, refer to Lau, J. H., *Ball Grid Array Technology*, McGraw-Hill, New York, (1995), which is herein incorporated by reference in its entirety.

Die-up and die-down BGA package configurations exist. In die-up BGA packages, the IC die is mounted on a top surface of the substrate or stiffener, in a direction away from the PCB. In die-down BGA packages, the IC die is mounted on a bottom surface of the substrate or stiffener, in a direction towards the PCB.

A number of BGA package substrate types exist, including ceramic, plastic (PBGA), and tape (also known as "flex"). FIG. 1A illustrates a conventional flex BGA package 100. Flex BGA package 100 includes an IC die 102, a tape substrate 104, a plurality of solder balls 106, and one or more wire bonds 108. Tape or flex BGA packages are particularly appropriate for large IC dies with large numbers of input and outputs, such as application specific integrated circuits (ASIC) and microprocessors.

Tape substrate 104 is generally made from one or more conductive layers bonded with a dielectric material. For instance, the dielectric material may be made from various substances, such as polyimide tape. The conductive layers are typically made from a metal, or combination of metals, such as copper and aluminum. Trace or routing patterns are made in the conductive layer material. Substrate 104 may be a single-layer tape, a two-layer tape, or additional layer tape substrate type. In a two-layer tape, the metal layers sandwich the dielectric layer, such as in a copper-Upilex-copper arrangement.

IC die 102 is attached directly to substrate 104, for example, by an epoxy. IC die 102 is any type of semiconductor integrated circuit, separated from a semiconductor wafer.

One or more wire bonds 108 connect corresponding bond pads 118 on IC die 102 to contact points 120 on substrate 104.

An encapsulate, mold compound, or epoxy 116 covers IC die 102 and wire bonds 108 for mechanical and environmental protection.

Figure 1B:
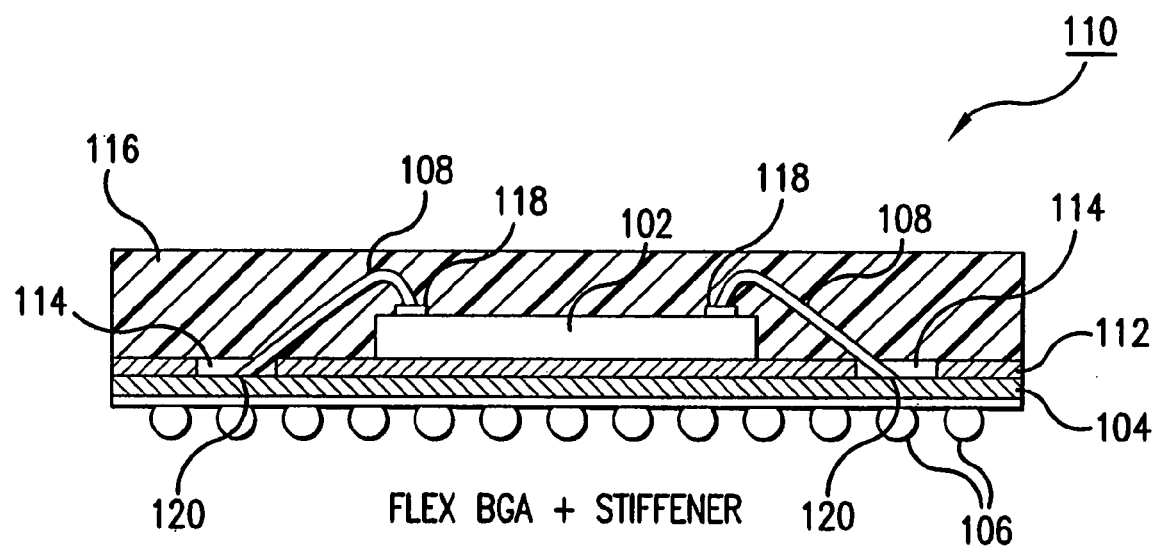

As shown in FIG. 1A, flex BGA package 100 does not include a stiffener. In some BGA package types, particularly in flex BGA packages, a stiffener can be attached to the substrate to add planarity and rigidity to the package. FIG. 1B illustrates a flex BGA package 110, similar to flex BGA package 100, that incorporates a stiffener 112. Stiffener 112 may be laminated to substrate 104. Stiffener 112 is typically made from a metal, or combination of metals, such as copper, tin, and aluminum, or may be made from a polymer, for example. Stiffener 112 also may act as a heat sink, and allow for greater heat spreading in BGA package 110. One or more openings 114 in stiffener 112 may be used to allow for wire bonds 108 to connect IC die 102 to substrate 104. Stiffener 112 may be configured in other ways, and have different opening arrangements than shown in FIG. 1B.

Figure 2A:
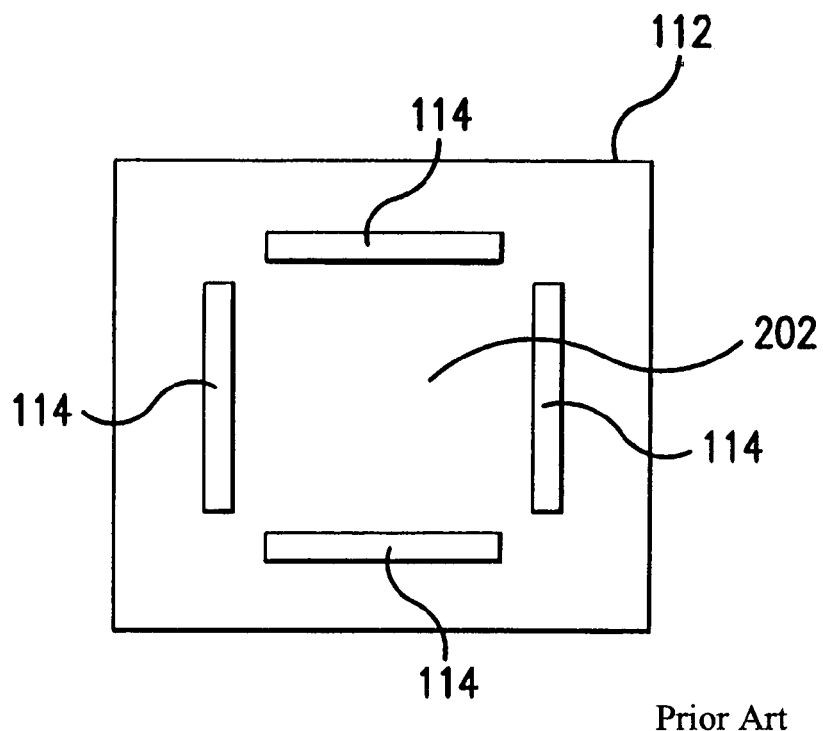
FIG. 2A shows a top view of a stiffener.
Figure 2B:
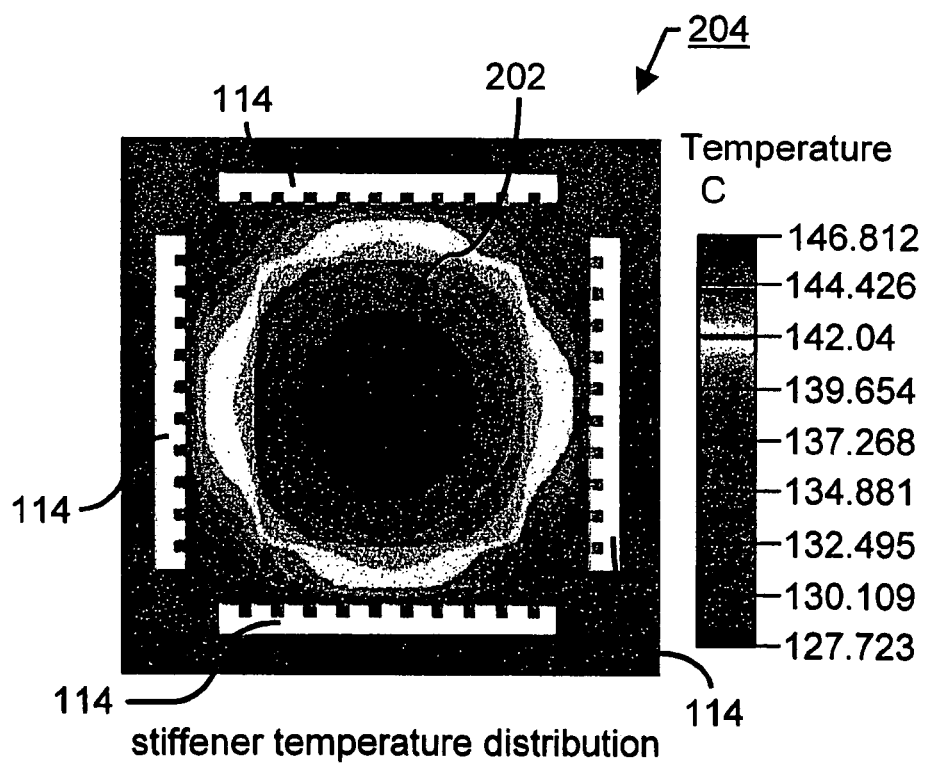
FIG. 2B shows a temperature distribution for a stiffener during operation of an IC device in a flex BGA package.

The use of a stiffener in a flex BGA package requires additional considerations when attempting to manage heat spreading. FIG. 2A shows a top view of a stiffener 112. Stiffener 112 includes an opening 114 adjacent to all four sides of an IC die mounting position 202 in the center of stiffener 112. FIG. 2B shows a temperature distribution 204 of a stiffener, such as stiffener 112, during operation of an IC die in a flex BGA package. Temperature distribution 204 shows that heat transfer from IC die mounting position 202 to the edges of stiffener 112 is substantially limited by openings 114. Openings 114 act as thermal barriers to heat spreading in stiffener 112.

Figure 2C:
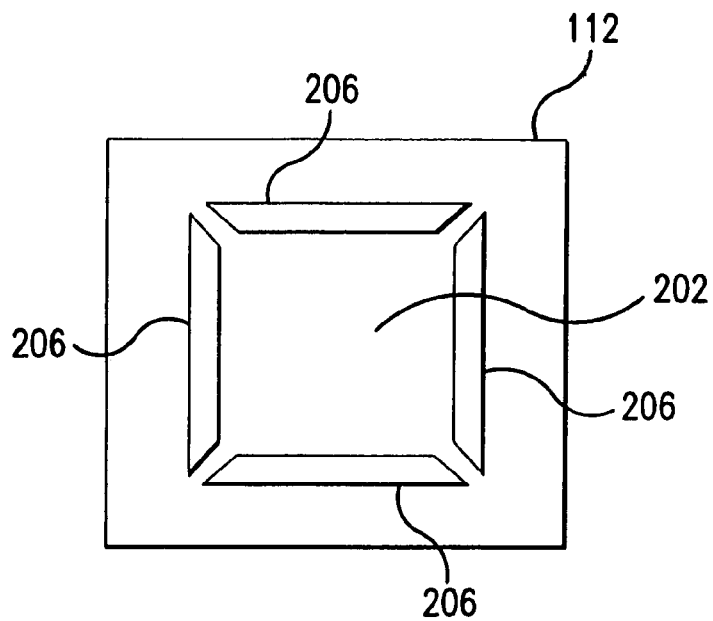
FIG. 2C shows an top view of an alternative stiffener configuration.

FIG. 2C shows atop view of an alternative configuration for stiffener 112, according to an embodiment of the present invention. Stiffener 112 includes an opening 206 adjacent to all four sides of an IC die mounting position 202 in the center of stiffener 112. Openings 206 are similar to openings 114 of FIG. 2A, but of different shape. Further alternatively shaped openings in stiffener 112 are applicable to the present invention.

Figure 3:
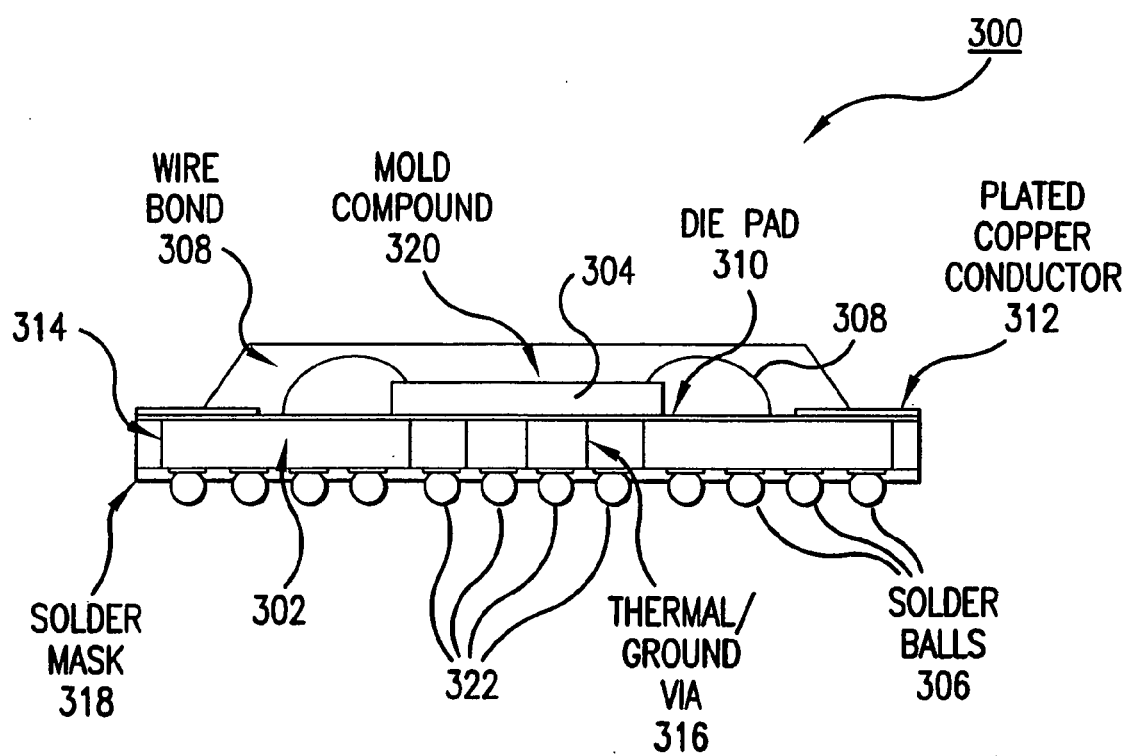
FIG. 3 shows a cross-sectional view of a conventional die-up plastic BGA package.

FIG. 3 shows a cross-sectional view of a conventional die-up PBGA package 300. PBGA package 300 includes a plastic substrate 302, an IC die 304, a plurality of solder balls 306, a plurality of wire bonds 308, a die pad 310, one or more vias 314, and one or more thermal/ground vias 316.

Plastic substrate 302 includes one or more metal layers formed on an organic substrate (for example, BT resin or FR4 epoxy/glass). IC die 304 is mounted to die pad 310. IC die 304 may be attached to die pad 310 with an epoxy, such as a silver-filled epoxy. Wire bonds 308 connect signals of IC die 304 to substrate 302. For instance, gold bonding wire is bonded from aluminum bond pads on IC die 304 to gold-plated contact pads on substrate 302. The contact pads on substrate 302 connect to solder balls 306 attached to the bottom surface of substrate 302, through vias 314 and routing within substrate 302 using copper conductors 312. Thermal/ground vias 316 connect die pad 310 to one or more thermal/ground balls 322 on the center bottom surface of substrate 302. An encapsulate, mold compound, or epoxy 320 covers IC die 304 and wire bonds 308 for mechanical and environmental protection.

Figure 12A:
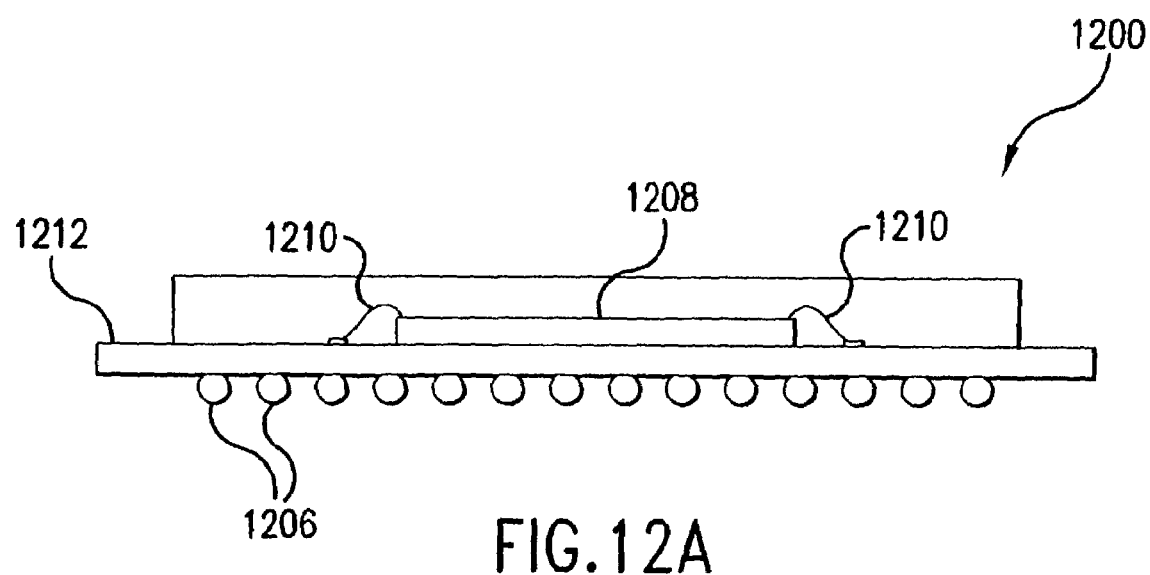
FIG. 12A illustrates a cross-sectional view of a die-up BGA package.
Figure 12B:
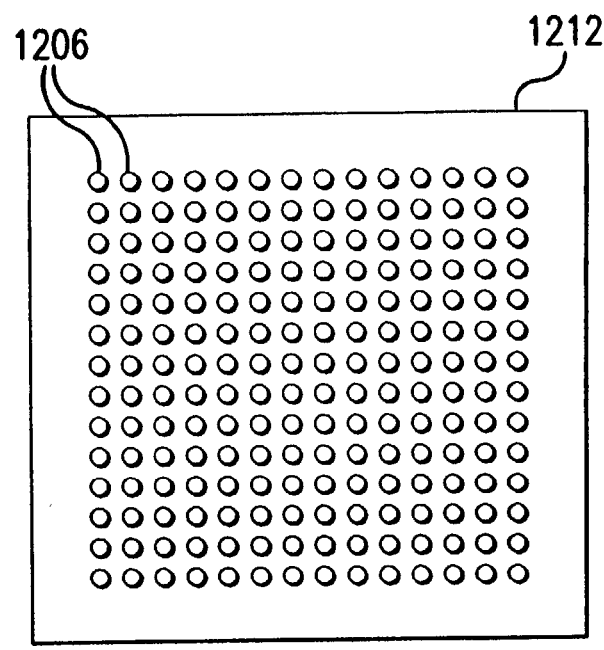
FIGS. 12B and 12C illustrate exemplary solder ball arrangements or the die-up BGA package of FIG. 12A.
Figure 12C:
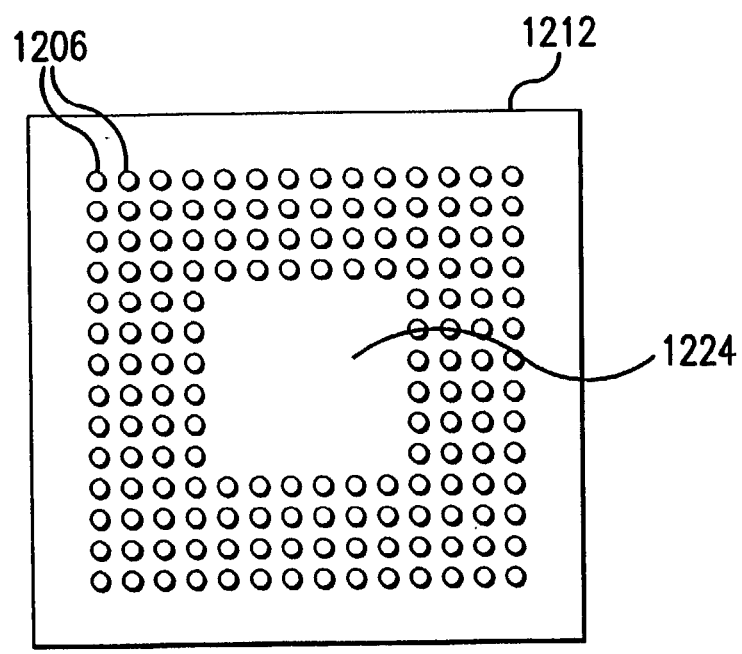

As described above, a BGA package includes an array of solder balls located on a bottom external surface of the package substrate. FIG. 12A illustrates a cross-sectional view of a die-up BGA package 1200. FIGS. 12B and 12C illustrate exemplary solder ball arrangements for die-up B GA package 1200. As shown in FIG. 12A, BGA package 1200 includes an IC die 1208 mounted on a substrate 1212. IC die 1208 is electrically connected to substrate 1212 by one or more wire bonds 1210. Wire bonds 1210 are electrically connected to solder balls 1206 underneath substrate 1212 through corresponding vias and routing in substrate 1212. The vias in substrate 1212 can be filled with a conductive material, such as solder, to allow for these connections. Solder balls 1206 are attached to substrate 1212, and are used to attach the BGA package to a PCB.

Note that although wire bonds, such as wire bonds 1210, are shown and described herein, IC dies may be mounted and coupled to a substrate with solder balls located on the bottom surface of the IC die, by a process commonly referred to as "C4" or "flip chip" packaging.

As shown in FIG. 12B, solder balls 1206 may be arranged in an array. FIG. 12B shows a 14 by 14 array of solder balls on the bottom surface of BGA package 1200. Other sized arrays of solder balls are also applicable to the present invention. Solder balls 1206 are reflowed to attach BGA package 1200 to a PCB. The PCB may include contact pads to which solder balls 1206 are bonded. PCB contact pads are generally made from a metal or combination of metals, such as copper, nickel, tin, and gold.

FIG. 12C shows a bottom view of BGA package 1200, with an alternative solder ball array arrangement. BGA package 1200 attaches an array of solder balls 1206 on a bottom surface of substrate 1212. As shown in FIG. 12C, solder balls 1206 are located in a peripheral area of the bottom surface of substrate 1212, away from a substrate center 1224. For example, solder balls 1206 on the bottom surface of substrate 1212 may be located outside an outer profile area of an IC die mounted on the opposite surface of substrate 1212. The solder ball array may be organized in any number of ways, according to the requirements of the particular BGA package application.

The solder ball arrangement shown in FIG. 12C is particularly applicable to embodiments of the present invention described below, such as for attaching a heat spreader or ground/thermal connector to a bottom surface of a BGA package. The heat spreader or ground/thermal connector may be connected in substrate center 1224.

Figure 13:
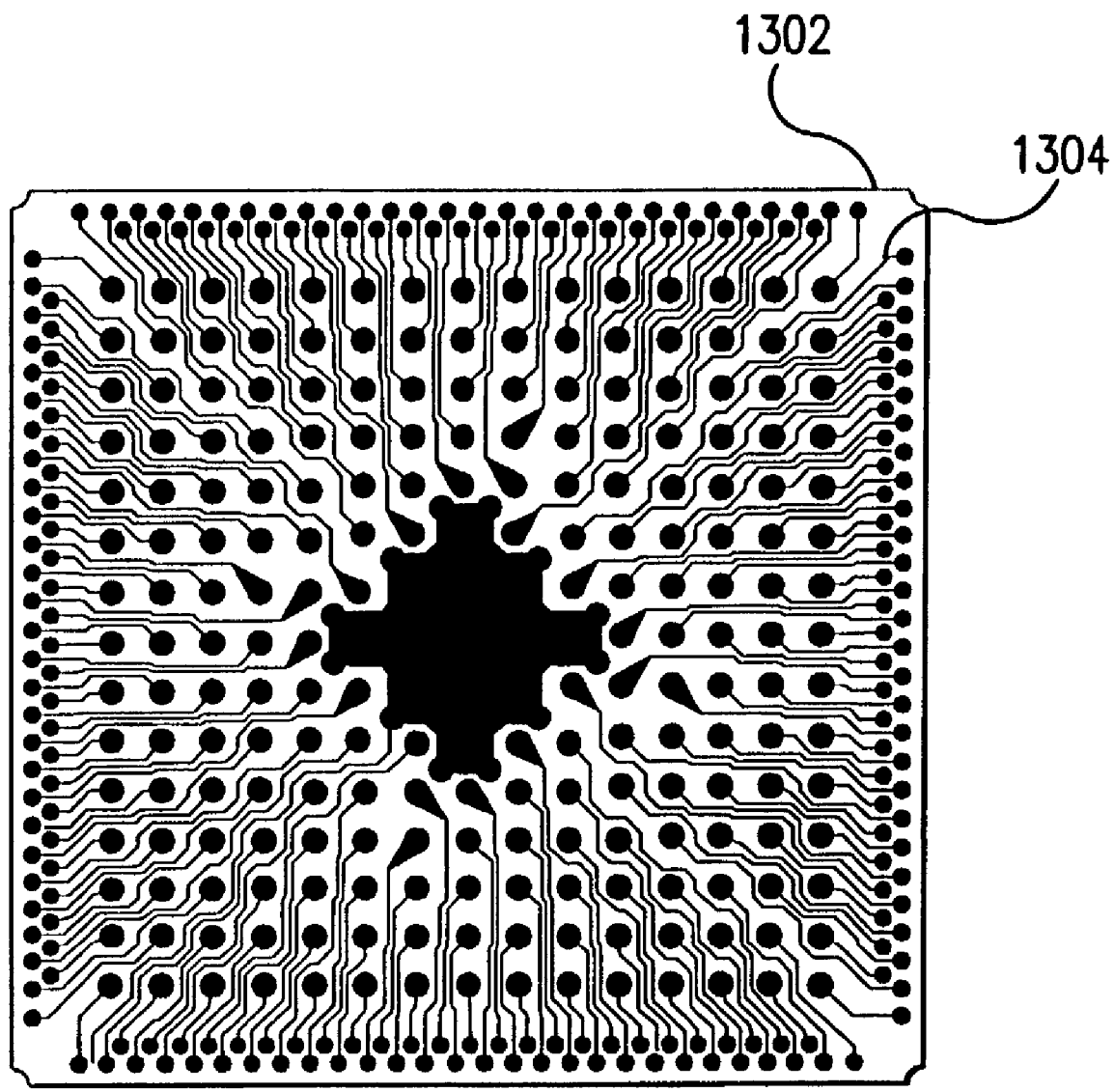
FIG. 13 shows exemplary routing in a substrate layer.

As described above, the BGA package substrate provides vias and routing on one or more layers to connect contact pads for wire bonds on its upper surface to solder balls attached to the bottom substrate surface. FIG. 13 shows an example routing 1304 in a substrate layer 1302 for accomplishing this.

The present invention is applicable to improving thermal and electrical performance in the BGA package types described herein, and further BGA package types.

BGA Embodiments According to the Present Invention

Further details of structural and operational implementations of ball grid array packages of the present invention are described in the following sections. These structural and operational implementations are described herein for illustrative purposes, and are not limiting. For instance, the present invention as described herein may be implemented in both die-up and die-down BGA package types, as well as other IC package types. Furthermore, each of the embodiments presented below are applicable to tape substrate BGA packages, plastic substrate BGA packages, and ceramic substrate BGA packages. The description below is adaptable to these and other package types, as would be understood to persons skilled in the relevant art(s) from the teachings herein. For instance, in plastic substrate BGA packages, and some tape BGA packages, a stiffener may not be required in the BGA package.

Features of each of the embodiments presented below may be incorporated into BGA packages independently, or may be combined in any manner, as would be apparent to persons skilled in the relevant art(s) from the teachings herein.

Drop-in Heat Spreader Embodiments

According to an embodiment of the present invention, a heat spreader may be used in a BGA package to provide for thermal stress relief and heat dissipation. In a preferred embodiment, a drop-in heat spreader is attached to the top surface of an IC die in a flex BGA package to provide for thermal stress relief and heat dissipation.

Figure 4:
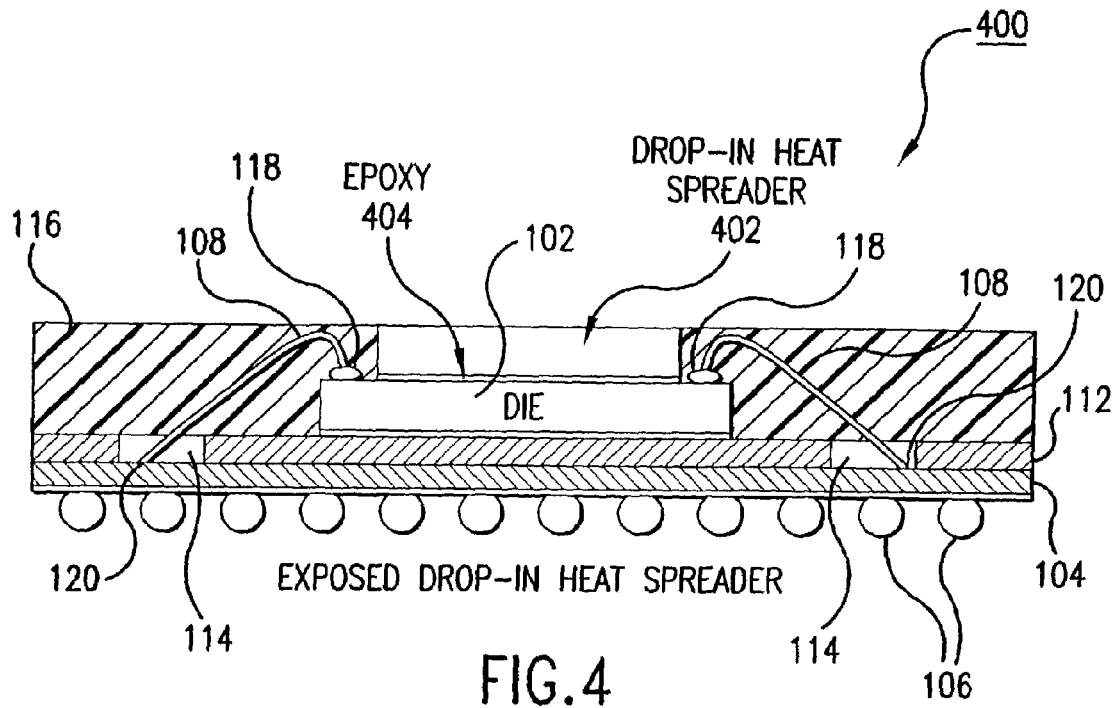
FIG. 4 illustrates a cross-sectional view of a die-up flex BGA package with heat spreader, according to an embodiment of the present invention.

FIG. 4 illustrates a cross-sectional view of a die-up flex BGA package 400, according to an embodiment of the present invention. BGA package 400 includes IC die 102, substrate 104, plurality of solder balls 106, one or more wire bonds 108, stiffener 112, epoxy 116, a drop-in heat spreader 402, and an epoxy 404. Refer to the discussion above related to FIGS. 1A–1B for additional detail on the structure and operation of some of these elements.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed.

Stiffener 112 has a top surface to which IC die 102 is mounted. In alternate embodiments, BGA package 400 does not require a stiffener, and does not include a stiffener 112. In such an alternate embodiment, IC die 102 is mounted to substrate 104.

One or more wire bonds 108 connect corresponding bond pads 118 on IC die 102 to contact points 120 on substrate 104. When a stiffener 112 is present, as shown in FIG. 4, wire bonds 108 extend through one or more openings 114 in stiffener 112 to form connections with substrate 104.

Heat spreader 402 is attached to the top surface (active surface) of IC die 102 using epoxy 404. The epoxy 404 may be the same substance as epoxy 116, or may be a different substance. Silver filled epoxies may be used for epoxy 404 to enhance heat extraction from IC die 102.

As shown in FIG. 4, heat spreader 402 is smaller in area than the upper surface of IC die 102. Alternative sizes for heat spreader 402 are also applicable to the present invention, including sizes equal to the area of IC die 102, or larger areas. Heat spreader 402 is shaped and configured to spread heat from IC die 102, as is required by the application.

Figure 5:
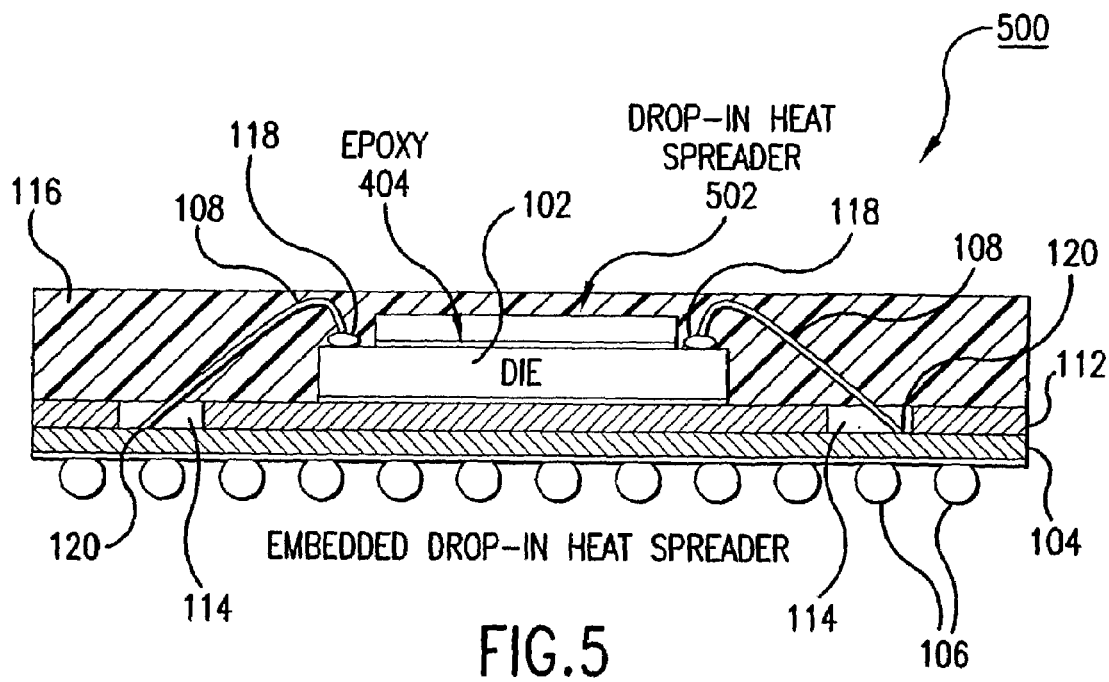
FIG. 5 show a cross-sectional view of an alternative BGA package, according to embodiments of the present invention, where the heat spreader is internal to the BGA package.

As shown in FIG. 4, the top surface of heat spreader 402 forms a portion of a top surface of BGA package 400. Heat dissipation to the environment can be improved by exposing the top surface of heat spreader 402. Furthermore, in such a configuration, additional heat sinks may be attached to heat spreader 402. FIG. 5 show a cross-sectional view of an alternative BGA package 500, according to embodiments of the present invention, where a heat spreader 502 is internal to BGA package 500. Heat spreader 502 is completely encapsulated by epoxy 116.

By attaching heat spreader 402 to the top surface of IC die 102, the mechanical structure of BGA package 400 becomes more symmetrical in its center region, particularly when ground/thermal solder balls do not exist on the bottom surface of substrate 104 underneath the outer profile of IC die 102. Thermal stress at the interface of IC die 102 and stiffener 112 is substantially released or altered by heat spreader 402. Deformation caused by thermal stress in stiffener 112 and substrate 104 is substantially reduced through the use of heat spreader 402. Drop-in heat spreader 402 allows for even larger sizes for IC die 102 and greater I/O counts by providing for greater heat spreading capacity in BGA package 400.

Figure 14:
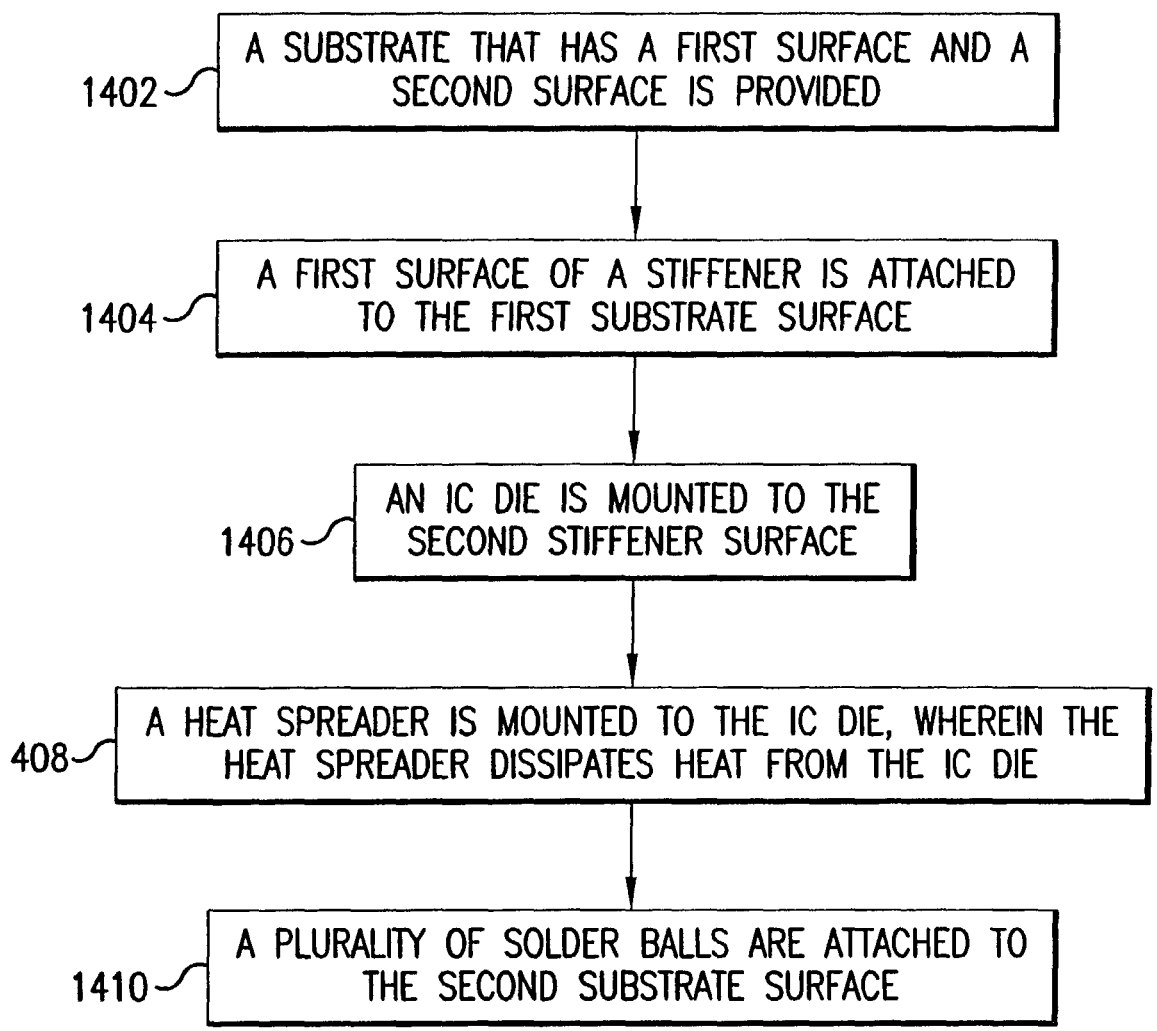
FIG. 14 shows a flowchart related to FIGS. 4 and 5, that provides operational steps of exemplary embodiments of the present invention.

FIG. 14 shows a flowchart 1400 providing operational steps for assembling one or more embodiments of the present invention. The steps of FIG. 14 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1400 begins with step 1402. In step 1402, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1404, a first surface of a stiffener is attached to the first substrate surface. For example, the stiffener is stiffener 112, which is attached to substrate 104. In alternative embodiments, a stiffener is not required.

In step 1406, an IC die is mounted to the second stiffener surface. For example, the IC die is IC die 102, which is mounted to stiffener 112. In alternative embodiments, when a stiffener is not used, IC die 102 is mounted directly to the substrate.

In step 1408, a heat spreader is mounted to the IC die, wherein the heat spreader dissipates heat from the IC die. For example, the heat spreader is heat spreader 402 or 502, which is mounted with epoxy 404 or other attachment means to the upper surface of IC die 102. Heat spreader 402 or 502 typically is mounted to the center of the upper surface of IC die 102, and covers less than the entire upper surface of IC die 102. For instance, the smaller area of heat spreader 402 or 502 allows for bond pads 118 to be exposed on the upper surface of IC die 102 for wire bond connections. In alternative embodiments, heat spreader 402 or 502 is of the same size, or comprises a larger area than the upper surface of IC die 102.

In step 1410, a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIGS. 12B and 12C, or in alternative arrangements. The solder balls are used to attach a BGA package to a PCB.

A benefit of performing the steps of flowchart 1400 is that the heat spreader relieves thermal stress at an interface of the IC die and the first stiffener surface.

Flowchart 1400 may include the additional step where the second stiffener surface is encapsulated. For instance, the second stiffener surface may be encapsulated by a resin or molding compound, that also encapsulates the IC die, heat spreader, and wire bonding.

Stiffener Ground Plane Embodiments

According to an embodiment of the present invention, electrical performance of an IC die, and thermal performance of a corresponding BGA package may be improved by allowing a stiffener to act as a ground plane. In a preferred embodiment, a stiffener in a die-up tape BGA (Flex BGA) package is coupled to PCB ground through one or more vias to ground solder balls. Ground contact pads of the IC die are connected to the stiffener by ground wire bonds. In a further aspect, one or more metal layers of a flex tape substrate may be coupled to a ground or power potential, to operate as a ground or power plane.

Figure 6:
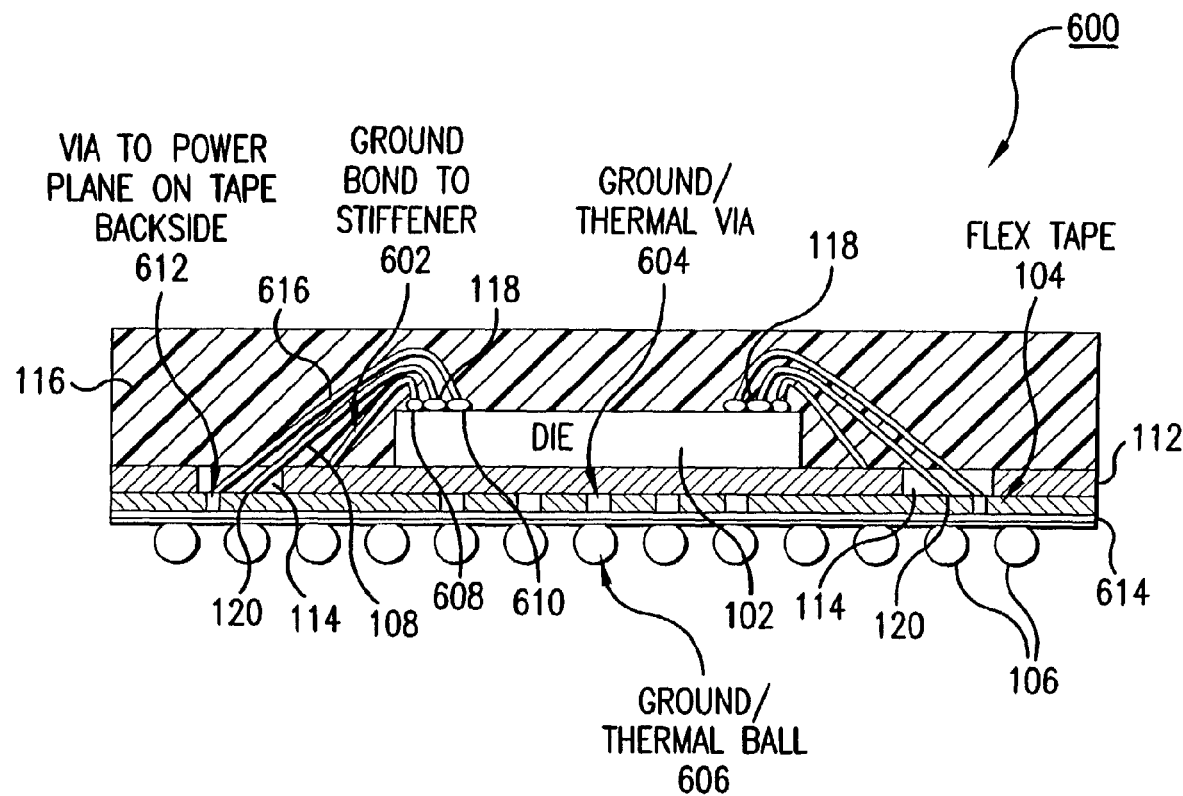
FIG. 6 illustrates a cross-sectional view of a die-up flex BGA package with stiffener ground plane, according to an embodiment of the present invention.

FIG. 6 illustrates a cross-sectional view of a die-up flex BGA package 600, according to an embodiment of the present invention. BGA package 600 includes IC die 102, substrate 104, plurality of solder balls 106, one or more wire bonds 108, stiffener 112, epoxy 116, one or more ground bonds to stiffener 602, one or more ground/thermal vias 604, one or more ground/thermal balls 606, one or more ground contact pads 608, one or more power contact pads 610, and one or more power vias 612.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed.

Stiffener 112 has a top surface to which IC die 102 is mounted.

One or more wire bonds 108 connect corresponding bond pads 118 on IC die 102 to contact points 120 on substrate 104. Wire bonds 108 extend through one or more openings 114 in stiffener 112 to form connections with substrate 104.

IC die 102 has a top surface that includes at least one ground pad 608. Ground pad 608 is coupled to a ground potential signal in IC die 102. A ground wire bond 602 connects ground pad 608 to stiffener 112. The bottom surface of stiffener 112 is coupled to a ground potential signal in the PCB to which BGA package 600 is attached, to cause stiffener 112 to operate as a ground plane. Stiffener 112 is coupled to PCB ground through one or more of ground/thermal via 604 that extend through substrate 104. The one or more of ground/thermal vias 604 are located in substrate 104, underneath IC die 102, and can be filled with a conductive material, such as solder. A ground/thermal solder ball 606 is attached to each ground/thermal via 604 on the bottom surface of substrate 104. Ground/thermal solder ball 606 forms the connection to PCB ground, when reflowed to attach to the PCB. Each ground/thermal via 604 connects the respective ground/thermal solder ball 606 to stiffener 112 both electrically and thermally.

In a further embodiment, a tape substrate is configured such that a metal layer is used as a package power or ground plane. For instance, with a two-layer tape substrate, the bottom metal layer may be used as a power or ground plane.

In FIG. 6, PCB package 600 includes a bottom metal layer 614 of a two-layer tape substrate 104 that is coupled to a potential to operate as a power plane, according to an embodiment of the present invention. One or more power contact pads 610 on IC die 102 are coupled to a power potential signal in IC die 102. Power contact pad 610 on IC die 102 is connected to a corresponding power via 612 by a power wire bond 616. When a stiffener 112 is present, power wire bond 616 extends through opening 114. Power via 612 extends through substrate 104. Power via 612 can be filled with a conductive material, such as solder. Each power via 612 is coupled to the bottom metal layer 614 of substrate 104. Furthermore, one or more power vias 612 may be connected to corresponding solder balls on the bottom of substrate 104, to connect bottom metal layer 614 to PCB power pads when the solder balls are reflowed.

The introduction of a stiffener ground plane, and/or a power/ground plane using a metal layer of a tape substrate allows for very short power and ground connections. Current return path lengths are shortened, voltage drop across planes is reduced, and power/ground inductance is reduced. The shorter power and ground paths are also significant in reducing a power/ground path resistance, which advantageously reduces required IC device power levels.

For further description of the use of a thermal vias in a flex tape substrate, and of the use of a thermal ball coupled to a heat spreader in a die-down TBGA package, refer to U.S. Pat. No. 6,020,637, which is incorporated by reference in its entirety herein. For further description of the use of a thermal via and a thermal ball in a plastic substrate BGA package, refer to U.S. Pat. No. 5,894,410, which is incorporated by reference in its entirety.

Figure 15:
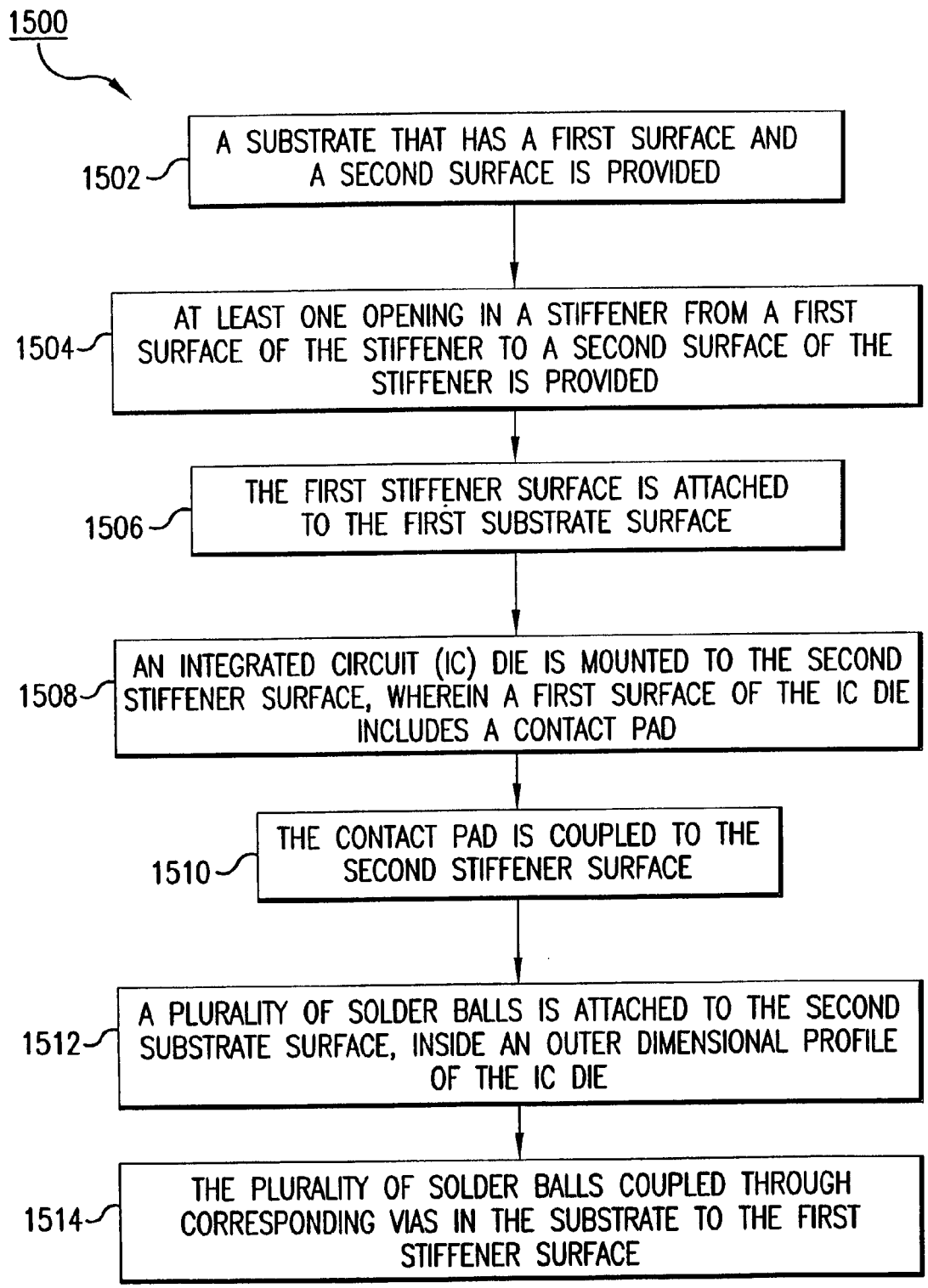
FIG. 15 shows a flowchart related to FIG. 6 that provides operational steps of exemplary embodiments of the present invention.

FIG. 15 shows a flowchart 1500 providing operational steps for assembling one or more embodiments of the present invention. The steps of FIG. 15 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1500 begins with step 1502. In step 1502, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1504, at least one opening in a stiffener from a first surface of the stiffener to a second surface of the stiffener is provided. For example, the at least one opening includes openings 114 in stiffener 112. In a preferred embodiment, an opening 114 is located on each of the four edges of IC die 102.

In step 1506, the first stiffener surface is attached to the first substrate surface. For example, the stiffener is stiffener 112, which is attached to substrate 104. In alternative embodiments, a stiffener is not required, and is not attached to the substrate.

In step 1508, an integrated circuit (IC) die is mounted to the second stiffener surface, wherein a first surface of the IC die includes a contact pad. For example, the IC die is IC die 102, which is mounted to stiffener 112. In alternative embodiments, when a stiffener is not used, IC die 102 is mounted directly to the substrate. For example, the contact pad is ground contact pad 608.

In step 1510, the contact pad is coupled to the second stiffener surface. For instance, contact pad is ground contact pad 608, which is connected to stiffener 112 by ground wire bond 602. Ground wire bond 602 may be soldered, or otherwise attached to stiffener 112.

In step 1512, a plurality of solder balls is attached to the second substrate surface, inside an outer dimensional profile of the IC die. For example, the plurality of solder balls include one or more ground/thermal balls 606, which are arranged on the bottom surface of substrate 104 in the region of substrate center 1224, shown in FIG. 12C. The outer dimensional profile of the IC die is the area bounded by the edges of IC die 102.

In step 1514, the plurality of solder balls are coupled through corresponding vias in the substrate to the first stiffener surface. For example, the vias include ground/thermal via 604. The vias can be filled with a conductive material, such as solder, to allow the electrical connection of the solder balls to stiffener 112.

In a further embodiment according to flowchart 1500, the substrate includes a metal layer, wherein the metal layer is coupled to a second potential. The stiffener has at least one opening extending from the first stiffener surface to the second stiffener surface. The second IC die surface includes a second contact pad. The second contact pad is coupled to the metal layer through one of the openings in the stiffener and through a corresponding via that extends through the substrate. The second contact pad may be coupled to a power or ground potential in the IC die. For example, the second contact pad is power contact pad 610, the metal layer is metal layer 614, and the corresponding via is power via 612.

In an embodiment, flowchart 1500 may include an additional step, where the contact pad is coupled to a ground potential in the IC die. For example, the contact pad may be connected to a ground plane or ground signal in IC die that is routed to the contact pad.

Flowchart 1500 may include the additional step where the second stiffener surface is encapsulated. For instance, the second stiffener surface may be encapsulated by a resin or molding compound, that also encapsulates the IC die and wire bonding.

Flowchart 1500 may include the additional step where a second plurality of solder balls is attached to the second substrate surface, outside an outer dimensional profile of the IC die. For example, the second plurality of solder balls are plurality of solder balls 106, which connect to vias and/or solder ball pads on the bottom surface of substrate 104. The solder balls are arranged on the bottom surface of substrate 104 as shown in FIG. 12B, outside of substrate center 1224. The solder balls are used to attach a BGA package to a PCB.

Embodiments with Stiffener Coupled to a PCB

According to an embodiment of the present invention, electrical performance of the IC device, and thermal performance of a BGA package is improved by enabling an IC die pad to attach to a PCB. In an embodiment, the IC die pad is attached to the PCB by a novel patterning of the metal stiffener in a die-up tape BGA package. In an alternate embodiment, the IC die pad is attached to the PCB by placing a thermal/ground connector between the IC die pad and PCB in a die-up tape BGA package.

A BGA package junction-to-board thermal resistance can be substantially reduced by the attachment of a metal die-attach pad directly to a PCB. Metal die-attach pads are coupled to a PCB for package junction-to-board thermal resistance minimization in an exposed pad quad flat pack (QFP), a QFP with exposed heat sink at bottom, and a leadless plastic chip carrier (i.e. LPCC, QFN, SON, QLP) package, for instance. All existing such designs that involve an exposed die pad or an exposed heat sink at package bottom are "lead frame" packages. The present invention provides for an exposed die-attach pad or heat sink at the bottom of flex BGA packages.

Figure 7:
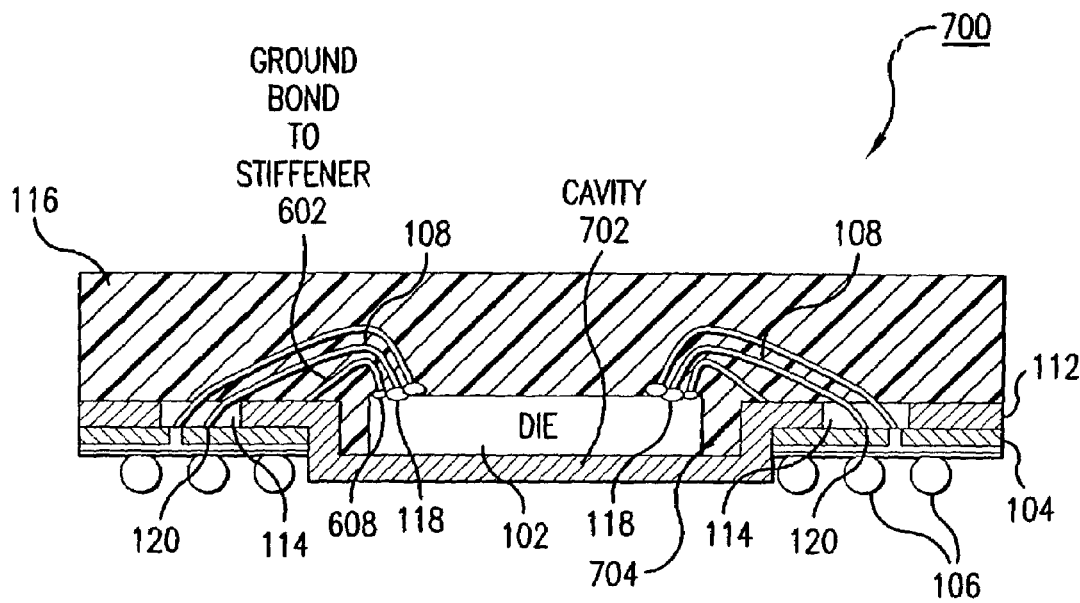
FIG. 7 illustrates a cross-sectional view of a die-up flex BGA package with patterned stiffener, according to an embodiment of the present invention.

FIG. 7 illustrates a cross-sectional view of a die-up flex BGA package 700, according to an embodiment of the present invention. BGA package 700 includes IC die 102, substrate 104, plurality of solder balls 106, one or more wire bonds 108, stiffener 112, epoxy 116, ground wire bond to stiffener 602, ground contact pad 608, and a stiffener cavity 702.

Figure 20:
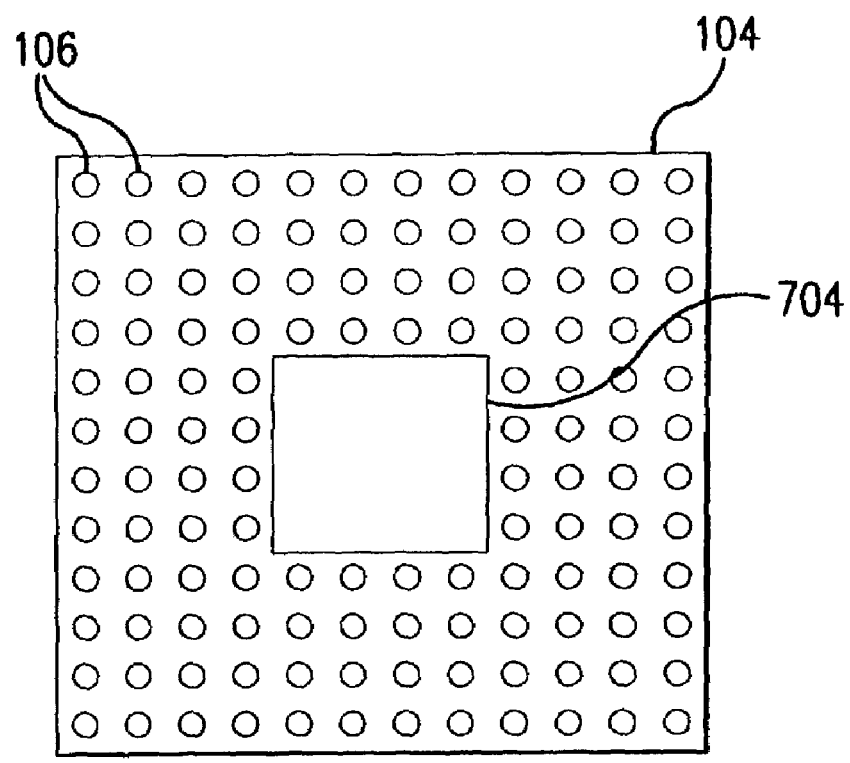
FIG. 20 illustrates a substrate that has a central window opening, according to an embodiment of the present invention.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed. Substrate 104 in FIG. 7 has a central window-shaped opening 704, under which solder balls are preferably not connected. FIG. 20 illustrates a bottom view of a substrate 104 that has a central window opening 704, according to an embodiment of the present invention.

Stiffener 112 has a top surface to which IC die 102 is mounted. Stiffener 112 in FIG. 7 is patterned with a cavity 702, which protrudes downward for attachment of IC die 102. As described above, a central window-shaped opening 704 exists in substrate 104. This opening 704 exists to allow stiffener 112 to protrude through, and make contact with soldering pads on a PCB to which BGA package 700 is to be mounted. The bottom exposed surface of cavity 702 can be plated with solder to facilitate surface mount to solder plated metal pads on a PCB to which BGA package 700 is mounted. Hence, stiffener 112 may act as a conduit for heat to be transferred from IC die 102 to the PCB.

Stiffener 112 may optionally be configured to operate as a ground plane. One or more ground pads 608 may be coupled to a ground potential signal in IC die 102. A ground wire bond 602 connects each ground pad 608 to stiffener 112. With one or more ground wire bonds 602 coupled to stiffener 602, the bottom exposed surface of cavity 702 may function both as an exposed ground pad of BGA package 700, and as an exposed heat spreader. As described above, the bottom exposed surface of cavity 702 may be plated with solder to allows stiffener 112 to be surface mounted to one or more soldering pads on the PCB. The pads on the PCB can be connected to a PCB ground plane to shorten the length of electrical current return paths, as well as to form a conductive heat dissipation path from BGA package 700 to the PCB.

Figure 8:
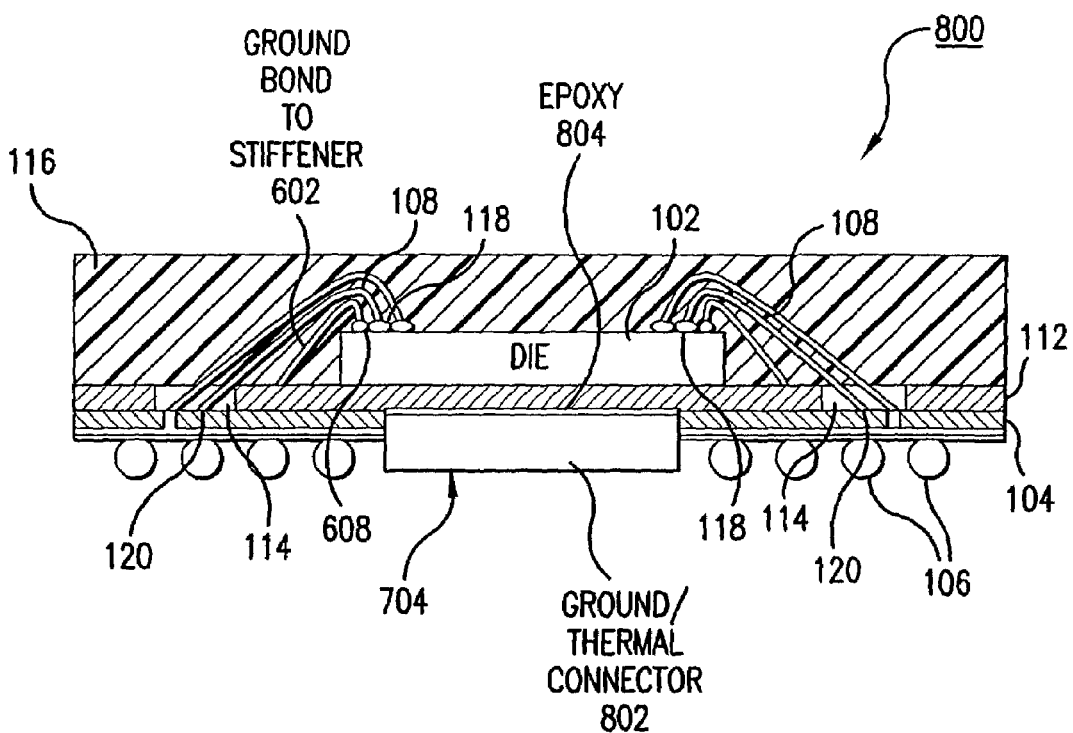
FIG. 8 illustrates a cross-sectional view of a die-up flex BGA package with ground/thermal connector, according to an embodiment of the present invention.

Direct electrical and thermal connection from BGA package ground to a PCB ground plane is also possible by attaching a heat spreader between the stiffener and PCB. FIG. 8 illustrates a cross-sectional view of a die-up flex BGA package 700, according to an embodiment of the present invention. Substrate 104 in FIG. 8 has a central window-shaped opening, under which no solder balls are connected. A portion of the bottom surface of stiffener 112 is exposed through the central window-shaped opening 704 of substrate 104. A heat spreader (for example, manufactured from copper or aluminum), shown as ground/thermal connector 802, is coupled to the exposed portion of stiffener 112. Ground/thermal connector 802 can be made from the same material as stiffener 112. Material different from stiffener 112 may be used for ground/thermal connector 802 to compensate for the mismatch of thermal expansion coefficient between the die 102 and stiffener 112. Ground/thermal connector 802 may be laminated to the exposed portion of stiffener 112 using conductive epoxy. The bottom surface of ground/thermal connector 802 may be plated with solder to facilitate its surface mount to soldering pads on the PCB. Metal pads on the PCB may be connected to a PCB ground plane to shorten the length of electrical current return paths, as well as enhance the conductive heat dissipation path from IC die 102 to the PCB. An advantage of this design is a high efficiency in the metal connector lamination process.

Figure 21:
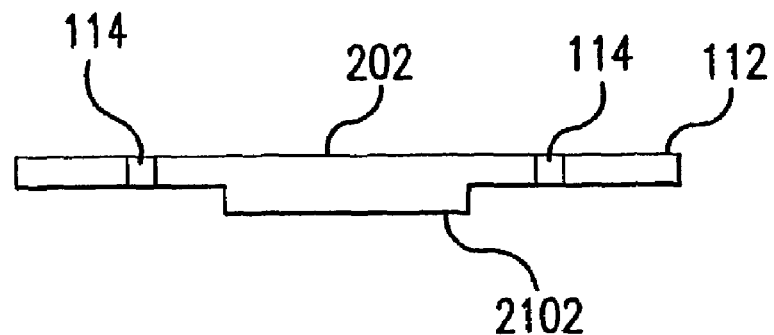
FIG. 21 illustrates a side view of a stiffener that has a downward protruding portion, according to an embodiment of the present invention.

In a further embodiment, stiffener 112 and ground/thermal connector 802 may be manufactured from a single piece of metal, and hence consist of a single metal piece. FIG. 21 illustrates a side view of stiffener 112 that has a downward protruding portion 2102, according to an embodiment of the present invention. When stiffener 112 shown in FIG. 21 is attached to substrate 104, portion 2102 extends partially or entirely through window-shaped opening 704. Portion 2102 may be directly connected to the PCB, or may be connected to a ground/thermal connector 802 that is connected to the PCB. Because of the thermal and electrical improvement enabled by the coupling of stiffener 112 to a PCB, length of wire bonds can be reduced by moving opening 114 closer to the proximity of die 102 without compromising thermal performance significantly.

Figure 16A:
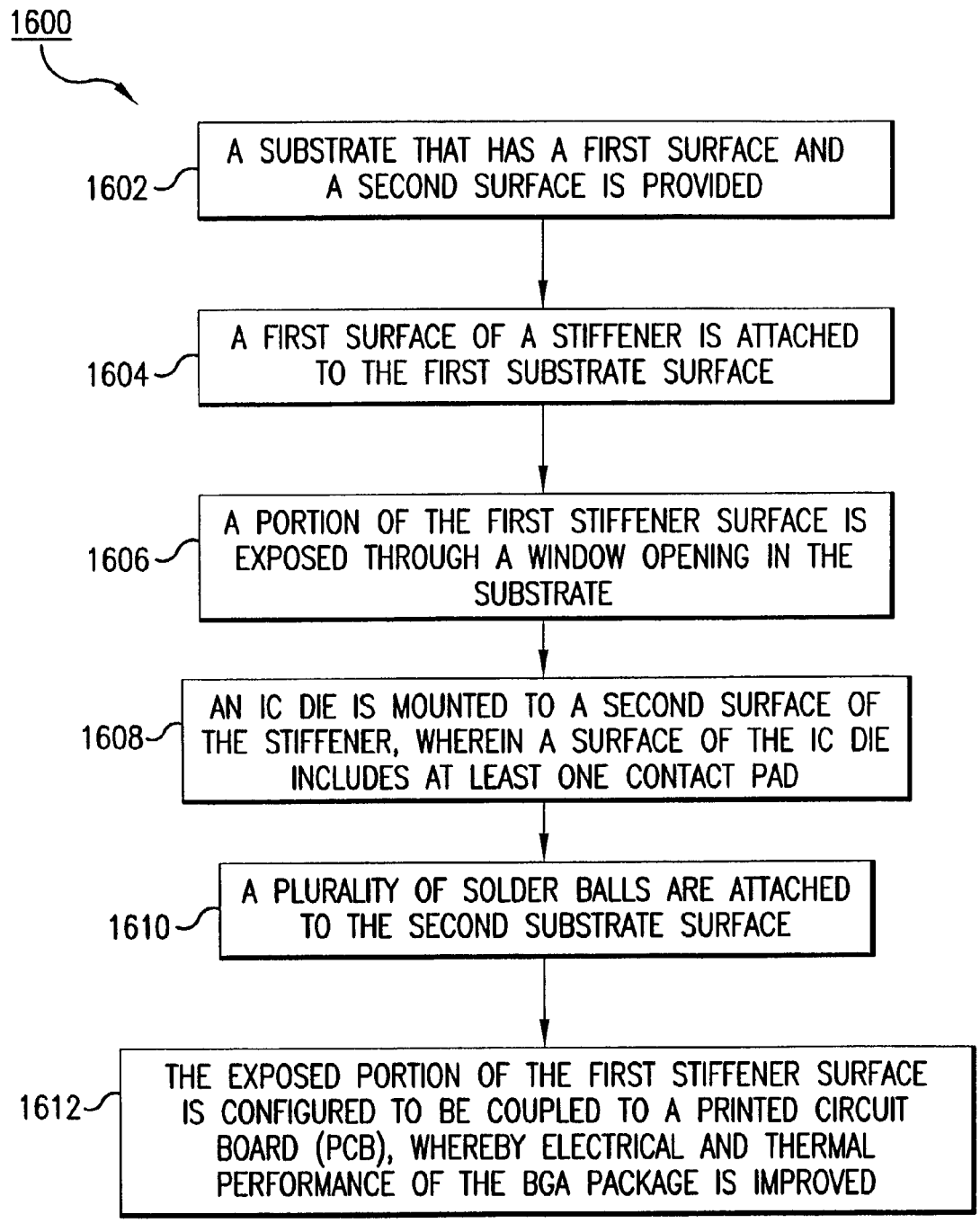
FIGS. 16A–D show flowcharts related to FIGS. 7 and 8 that provide operational steps of exemplary embodiments of the present invention.
Figure 16B:
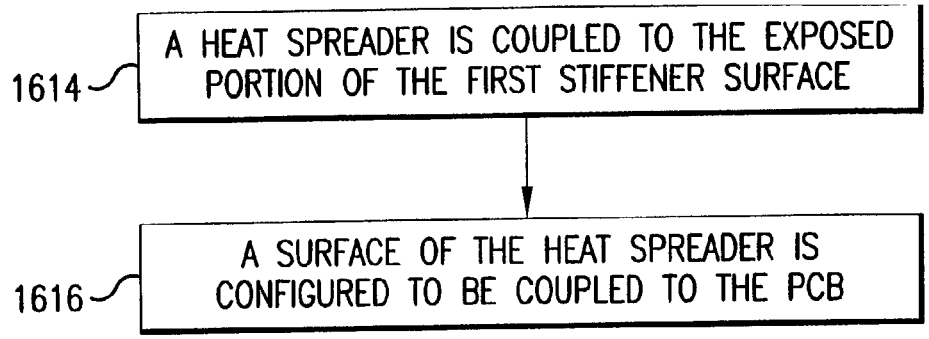
Figure 16C:
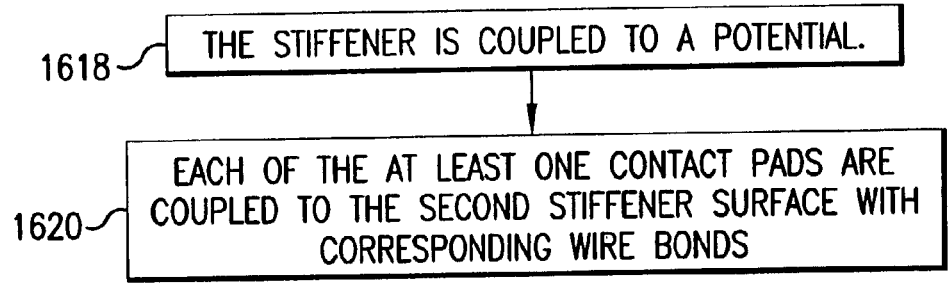
Figure 16D:
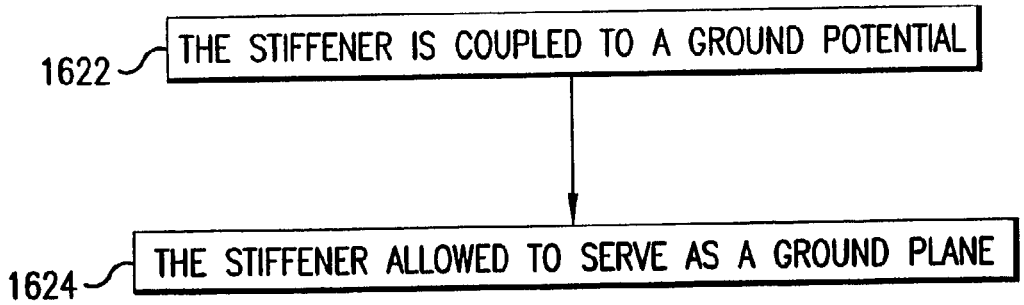

FIG. 16A shows a flowchart 1600 providing operational steps for assembling one or more embodiments of the present invention. FIGS. 16B–D provide operational steps according to further embodiments. The steps of FIGS. 16A–D do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1600 begins with step 1602. In step 1602, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1604, a first surface of a stiffener is attached to the first substrate surface. For example, the stiffener is stiffener 112, which is attached to substrate 104.

In step 1606, a portion of the first stiffener surface is exposed through a window opening in the substrate. For example, substrate 104 has a window opening 704 in its center. A portion of the bottom surface of stiffener 112 is exposed through window opening 704.

In step 1608, an IC die is mounted to a second surface of the stiffener, wherein a surface of the IC die includes at least one contact pad. For example, the IC die is IC die 102, which is mounted to stiffener 112.

In step 1610, a plurality of solder balls are attached to the second substrate surface. For example, the plurality of solder balls are plurality of solder balls 106, which connect to vias and/or solder ball pads on the bottom surface of substrate 104. The solder balls are arranged on the bottom surface of substrate 104 as shown in FIG. 12B, exclusive of the area of window opening 704. The solder balls are used to attach a BGA package to a PCB.

In step 1612, the exposed portion of the first stiffener surface is configured to be coupled to a printed circuit board (PCB), whereby electrical and thermal performance of the BGA package is improved.

FIG. 16B provides exemplary steps for performing step 1612:

In step 1614, a heat spreader is coupled to the exposed portion of the first stiffener surface. For example, the heat spreader is ground/thermal connector 802, which is coupled to stiffener 112 through window opening 702.

In step 1616, a surface of the heat spreader is configured to be coupled to the PCB. In an embodiment, step 1612 further includes the step where the heat spreader surface is plated with solder to allow the heat spreader surface to be surface mounted to soldering pads on the PCB.

In an alternate embodiment, step 1612 comprises the step where the stiffener is shaped to have a centrally-located cavity shaped portion that protrudes through the window opening. In an embodiment, step 1612 further includes the step where a surface of the cavity shaped portion is plated with solder to allow the stiffener to be surface mounted to soldering pads on the PCB. For example, stiffener 112 is patterned with a cavity 702, which protrudes downward in window opening 704. The bottom surface of cavity 702 is plated with solder.

FIG. 16C provides additional exemplary steps for flowchart 1600 of FIG. 16A:

In step 1618, the stiffener is coupled to a potential. For example, the stiffener may be coupled to ground or power on the PCB. The bottom surface of cavity 702 may be coupled to the ground or power potential on the PCB, or ground/thermal connector 802 may make the connection to the PCB.

In step 1620, each of the at least one contact pads are coupled to the second stiffener surface with corresponding wire bonds.

FIG. 16D provides exemplary steps for performing step 1618:

In step 1622, the stiffener is coupled to a ground potential.

In step 1624, the stiffener allowed to serve as a ground plane.

Flowchart 1600 may include the additional step where the second stiffener surface is encapsulated. For instance, the second stiffener surface may be encapsulated by an epoxy, that also encapsulates the IC die and wire bonding.

Metal Ring Embodiments

According to an embodiment of the present invention, the mechanical and thermal performance of a BGA package is enhanced by attaching a metal ring to the top surface of the stiffener. In a preferred embodiment, a metal ring is attached to the top surface of the stiffener in a die-up tape BGA package.

Figure 9A:
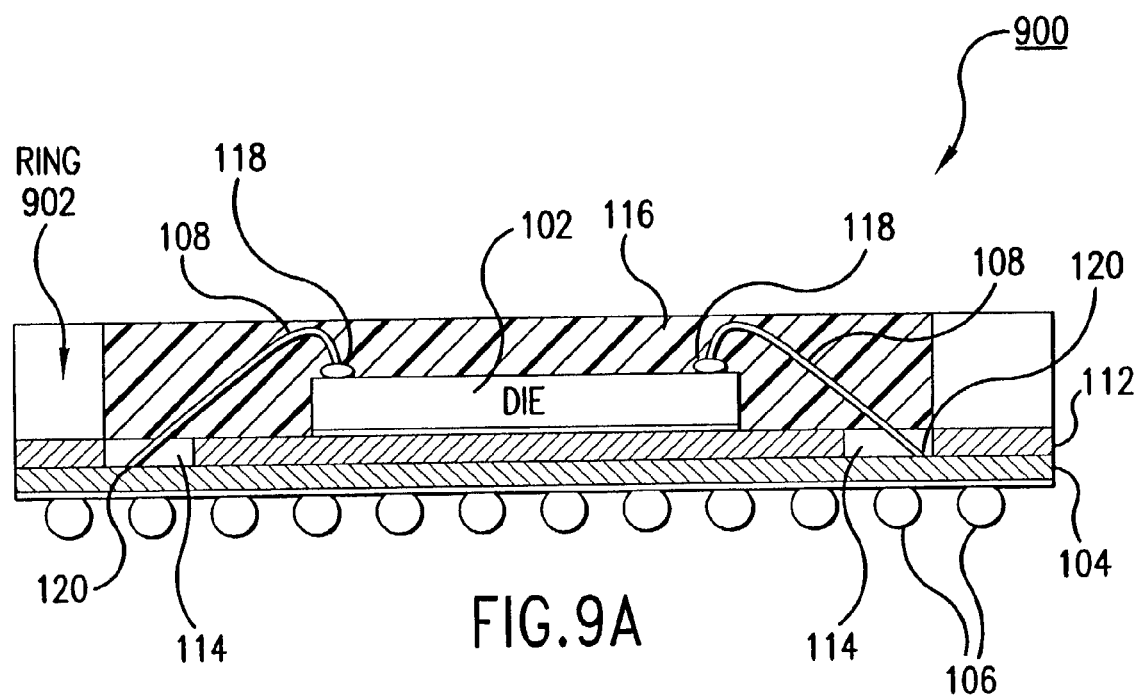
FIG. 9A illustrates a cross-sectional view of a die-up tape BGA package with metal ring, according to an embodiment of the present invention.
Figure 9B:
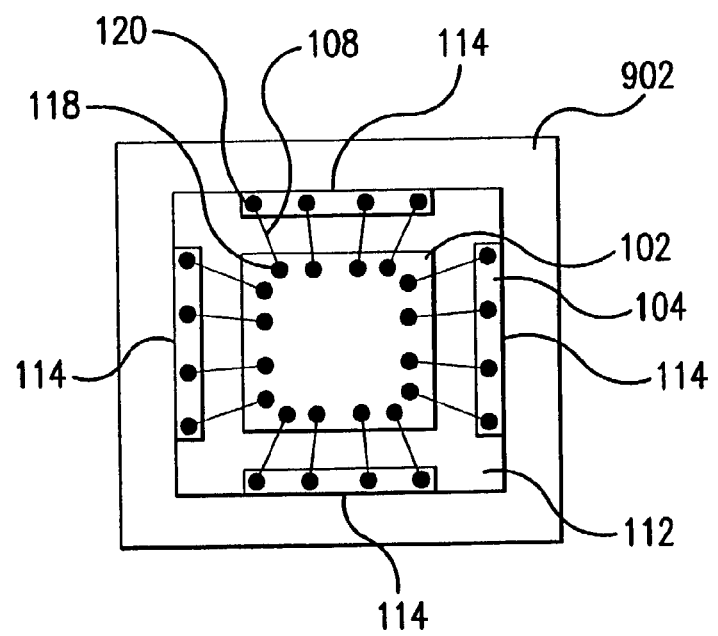
FIG. 9B illustrates a top view of the die-up tape BGA package with metal ring of FIG. 9A, according to an embodiment of the present invention.

FIG. 9A illustrates a cross-sectional view of a die-up tape BGA package 900, according to an embodiment of the present invention. BGA package 900 includes IC die 102, substrate 104, plurality of solder balls 106, one or more wire bonds 108, stiffener 112, epoxy 116, and a ring 902. FIG. 9B illustrates a top view of die-up tape BGA package 900, with ring 902.

Substrate 104 has a top surface to which a bottom surface of stiffener 112 is mounted. A bottom surface of substrate 104 attaches the plurality of solder balls 106. The plurality of solder balls 106 connect to vias and/or points on the bottom surface of substrate 104 to which signals internal to substrate 104 are routed and exposed.

One or more wire bonds 108 connect corresponding bond pads 118 on IC die 102 to contact points 120 on substrate 104. Wire bonds 108 extend through one or more openings 114 in stiffener 112 to form connections with substrate 104.

Stiffener 112 has a top surface to which IC die 102 is mounted. Furthermore, ring 902 is attached to the top surface of stiffener 112. Ring 902 may be laminated to stiffener 112, after wire bonding is completed. Epoxy 116 is filled in and flushed to ring 902 after the attachment of ring 902. Ring 902 is preferably made of a metal, such as copper or aluminum, or a combination thereof, but may be constructed from other applicable materials. Preferably, ring 902 is made from the same material as stiffener 112, to minimize the mismatch of the thermal expansion coefficient. Ring 902 is preferably flush with the outer edges of stiffener 112 to form an outer edge of BGA package 900, but may also reside entirely within an outer profile of stiffener 112.

A primary benefit of attaching ring 902 to stiffener 112 is an increase in stiffness of BGA package 900. Ring 902 also aids in reducing the amount of warp of BGA package 900. Furthermore, ring 902 promotes heat dissipation from stiffener 112, reduces junction-to-case thermal resistance, and facilitates the attachment of an external heat spreader to BGA package 900.

Furthermore, ring 902 enhances the process of encapsulation of the BGA package. Ring 902, with stiffener 112, creates a cavity that may be filled with a dispensed glob top or encapsulating material, that locks IC die 102 and surrounding elements in place.

Figure 17:
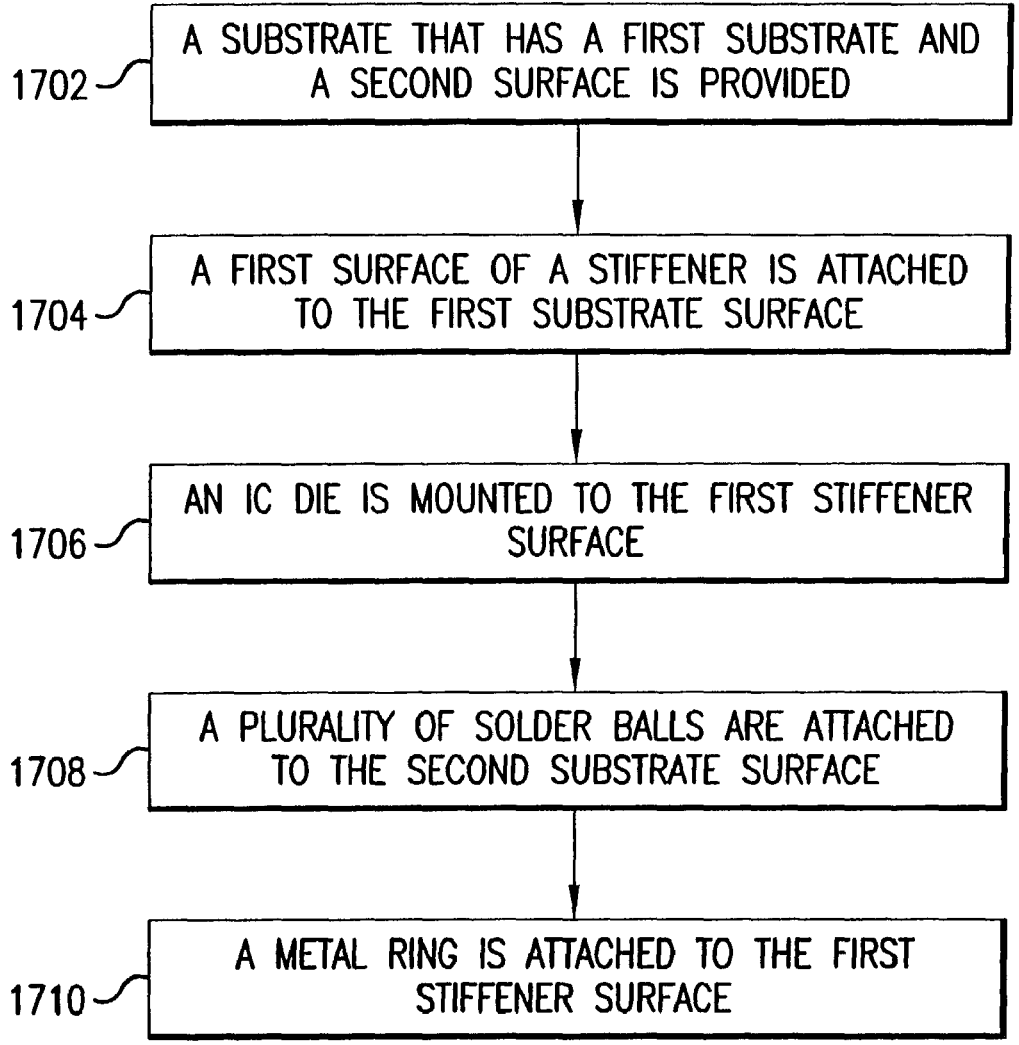
FIG. 17 shows a flowchart related to FIGS. 9A and 9B that provides operational steps of exemplary embodiments of the present invention.

FIG. 17 shows a flowchart 1700 providing operational steps for assembling one or more embodiments of the present invention. The steps of FIG. 17 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1700 begins with step 1702. In step 1702, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1704, a first surface of a stiffener is attached to the first substrate surface. For example, the stiffener is stiffener 112, which is attached to substrate 104. In alternative embodiments, a stiffener is not required, and is not attached to the substrate.

In step 1706, an IC die is mounted to the first stiffener surface. For example, the IC die is IC die 102, which is mounted to stiffener 112. In alternative embodiments, when a stiffener is not used, IC die 102 is mounted directly to the substrate.

In step 1708, a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIGS. 12B and 12C, or in alternative arrangements. The solder balls are used to attach a BGA package to a PCB.

In step 1710, a metal ring is attached to the first stiffener surface. Attaching the metal ring enhances heat dissipation from the stiffener. For example, the metal ring is ring 902. In alternative embodiments, when a stiffener is not used, ring 902 is attached directly to the substrate.

Flowchart 1700 may include the additional step where the second stiffener surface within the volume encompassed by the ring is encapsulated. For example, such a filled upper surface may be called a "glob top". For instance, this volume may be encapsulated by a resin or molding compound, that also encapsulates the IC die and wire bonding.

Embodiments Using Metal Studs to Bridge Stiffener Openings

According to an embodiment of the present invention, the thermal performance of a BGA package is improved by bridging an IC die pad to which the IC die is mounted to the outer regions of the stiffener. In a preferred embodiment, one or more metal studs are used as thermal bridges, to bridge the openings in the stiffener that surround the IC die, in a die-up tape BGA package.

The openings on a stiffener surface allow for wire bond connections between an IC die and a substrate. These openings have the additional effect of reducing the amount of heat that can spread to the outer surface regions of the stiffener, hampering the ability of the stiffener to act as a heat spreader. This effect is illustrated in FIG. 2B, which is further described above. To promote heat spreading according to the present invention, the stiffener is patterned such that one or more short studs run across each wire bond opening. More than one stud may be used to bridge each wire bond opening to promote heat spreading. The manufacturing process used for lead frame patterning may be adapted to pattern a stiffener with studs across the wire bond openings. The use of the studs, however, may reduce space for wire bonds, and may reduce BGA package I/O capability, in some situations.

Figure 10A:
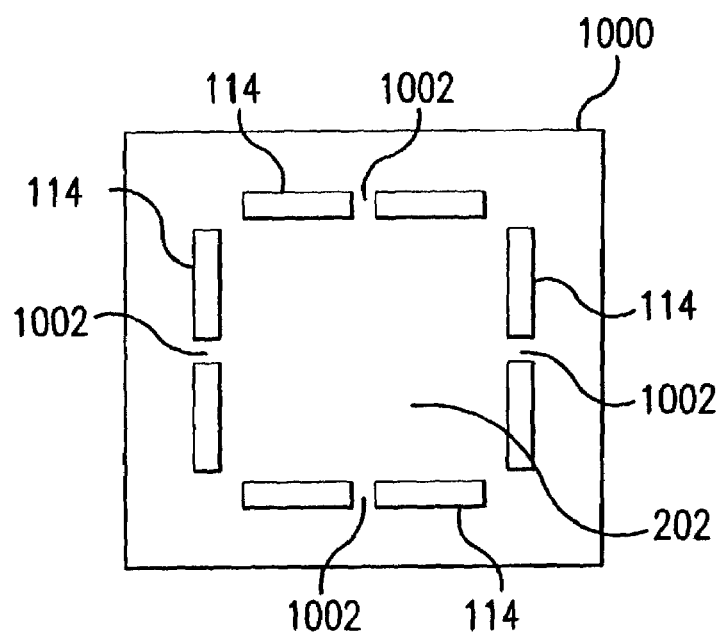
FIG. 10A illustrates a stiffener that includes one or more thermal studs, according to an embodiment of the present invention.

FIG. 10A illustrates a stiffener 1000, that includes one or more studs 1002, according to an embodiment of the present invention. Stiffener 1000, having one or more studs 1002, may be incorporated into a BGA package in the same manner as is described elsewhere herein for stiffener 112. As shown in FIG. 10A, a stud 1002 bridges each opening 114 in stiffener 1000. In alternative embodiments, more than one stud 1002 per opening 114 may be used. Furthermore, each opening 114 may be bridged by a different number of studs 1002. Some of openings 114 may be bridged by one or more studs 1002, while other openings 114 may not be bridged at all.

Figure 10B:
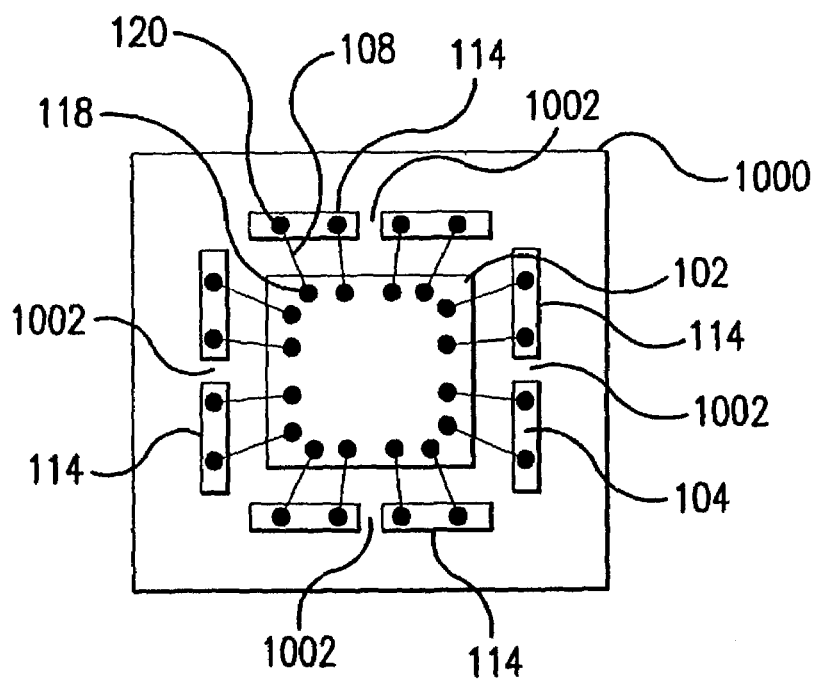
FIG. 10B illustrates an IC die that is wire bound to a substrate through openings in the stiffener of FIG. 10A, according to an embodiment of the present invention.

FIG. 10B provides an illustration where IC die 102 is wire bound to substrate 104 through stiffener 1000, according to an embodiment of the present invention. One or more wire bonds 108 connect corresponding bond pads 118 on IC die 102 to contact points 120 on substrate 104. Wire bonds 108 avoid studs 1002 when making connections to substrate 104.

Figure 18:
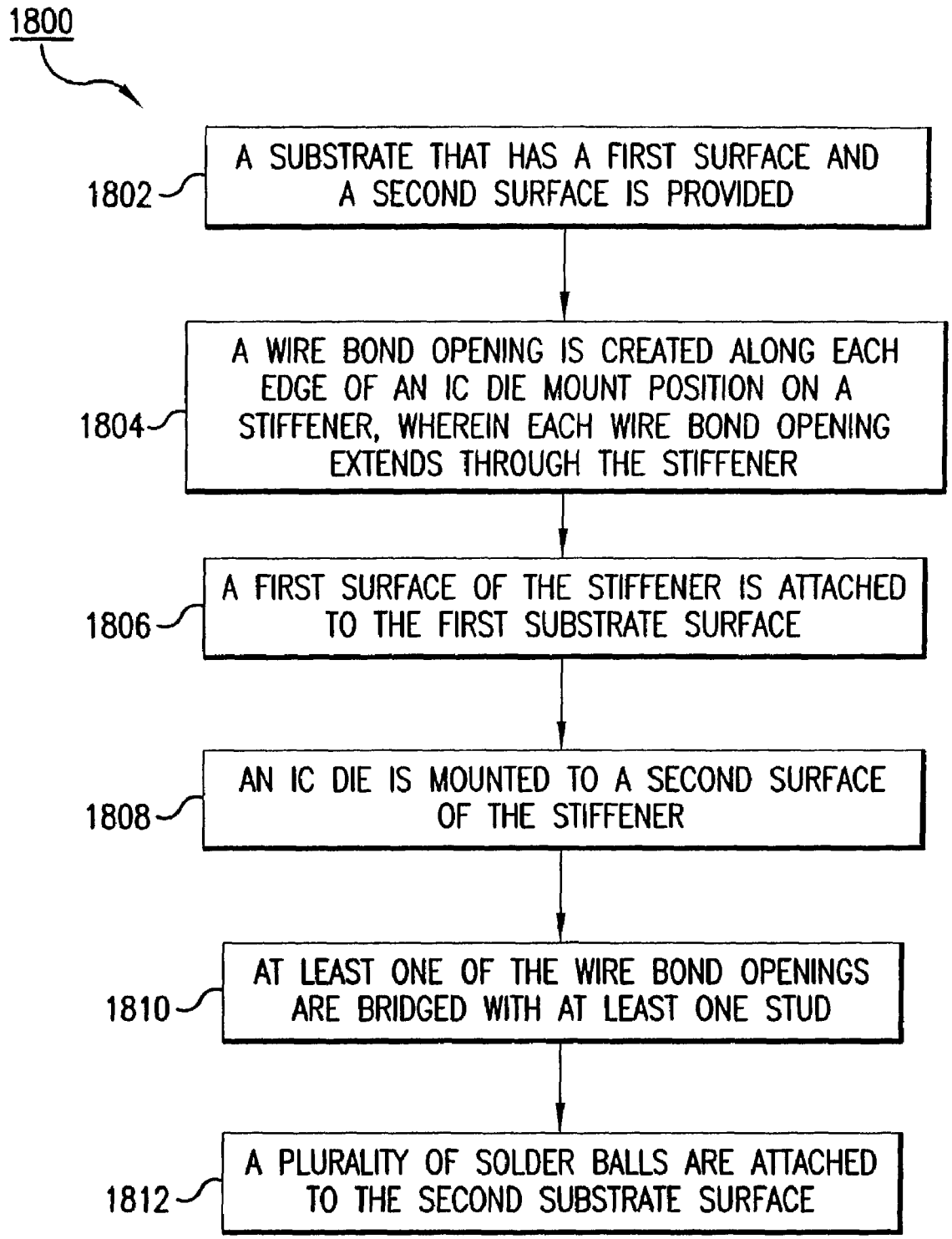
FIG. 18 shows a flowchart related to FIGS. 10A and 10B that provides operational steps of exemplary embodiments of the present invention.

FIG. 18 shows a flowchart 1800 providing operational steps for assembling one or more embodiments of the present invention. The steps of FIG. 18 do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1800 begins with step 1802. In step 1802, a substrate that has a first surface and a second surface is provided. For example, the substrate is flex substrate 104, or another substrate type suitable for a BGA package. For example, an IC die mounting position and/or contact points are provided on a first, upper surface, and solder ball pads are provided on a second, bottom surface.

In step 1804, a wire bond opening is created along each edge of an IC die mount position on a stiffener, wherein each wire bond opening extends through the stiffener. For example, the wire bond openings are wire bond openings 114 in stiffener 1000. The IC die mount position is IC die mounting position 202, shown in FIG. 10A.

In step 1806, a first surface of the stiffener is attached to the first substrate surface. For example, the stiffener is stiffener 1000, which is attached to substrate 104.

In step 1808, an IC die is mounted to a second surface of the stiffener. For example, the IC die is IC die 102, which is mounted to stiffener 1000, in IC die mounting position 202.

In step 1810, at least one of the wire bond openings are bridged with at least one stud. For example, one or more of wire bond openings 114 are bridged with one or more studs 1002. Studs 1002 allow for increased heat spreading across corresponding wire bond openings 114 to the outer edges of stiffener 1000.

In step 1812, a plurality of solder balls are attached to the second substrate surface. For example, the plurality of solder balls are plurality of solder balls 106, which connect to vias and/or solder ball pads on the bottom surface of substrate 104. The solder balls may be arranged on the bottom surface of substrate 104 as shown in FIGS. 12B and 12C, or in alternative arrangements. The solder balls are used to attach a BGA package to a PCB.

The flowchart 1800 may include the further step where a contact pad on the IC die is coupled to the substrate with a wire bond, wherein the wire bond passes through one of the wire bond openings in the stiffener.

Flowchart 1800 may include the additional step where the second stiffener surface is encapsulated. For instance, the second stiffener surface may be encapsulated by a resin or molding compound, that also encapsulates the IC die and wire bonding.

PBGA Thermal/Ground Connector Embodiments

According to an embodiment of the present invention, the electrical and thermal performance of a plastic BGA (PBGA) package is improved by attaching a thermal/ground connector to the bottom surface of a PBGA package. The thermal/ground connector couples the bottom center of a plastic substrate of a die-up PBGA to the PCB. Heat from an IC die is more easily spread to the PCB through the thermal/ground connector, which is attached to the plastic substrate underneath the IC die.

In the discussion above regarding FIG. 8, embodiments were described that used a ground/thermal connector to couple a flex BGA package to a PCB, to reduce package junction-to-board thermal resistance. Aspects of this discussion above is adaptable to other die-up BGA package types. These include BGA packages having an organic substrate, such as PBGA and fine pitch ball grid array (FBGA) packages. Further detailed description is provided in the following discussion that is applicable to BGA packages with organic substrates.

Figure 11:
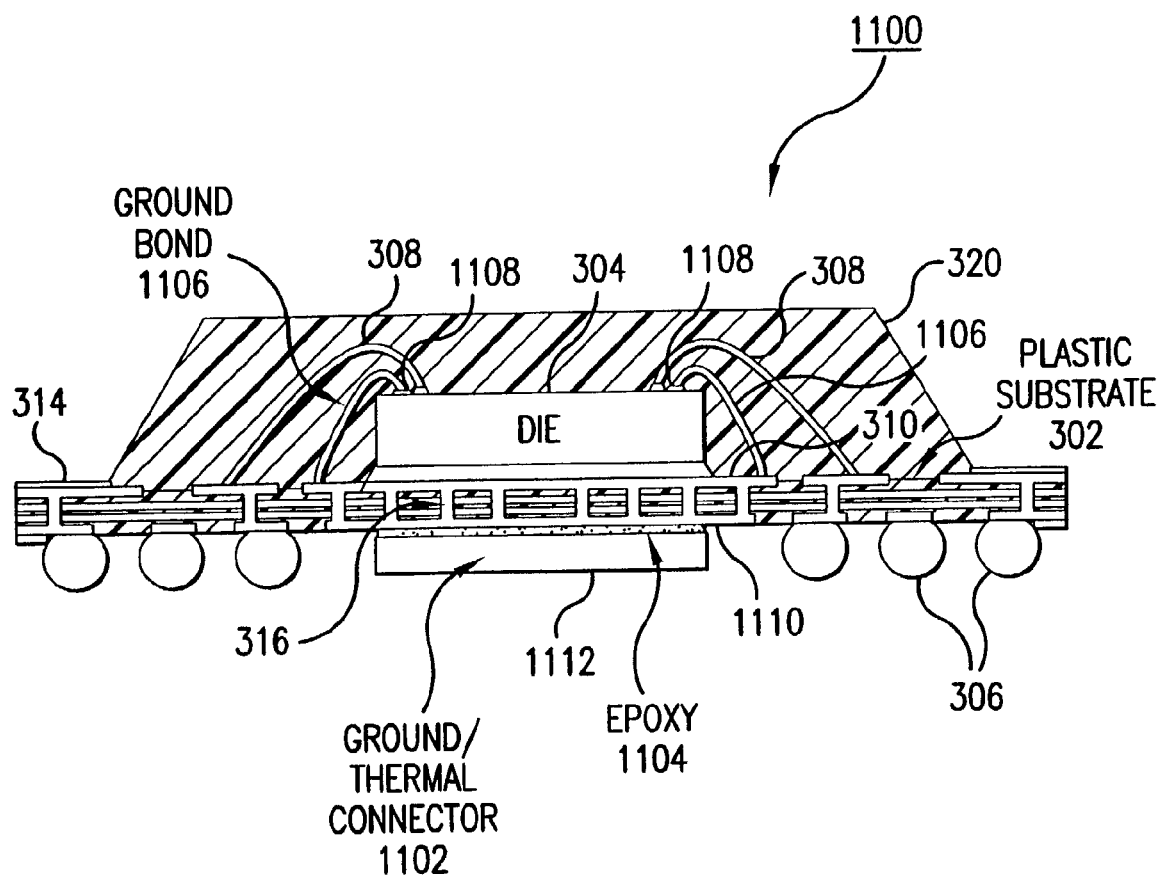
FIG. 11 illustrates a cross-sectional view of a die-up PBGA package with ground/thermal connector, according to an embodiment of the present invention.

FIG. 11 illustrates a cross-sectional view of a die-up PBGA package 1100, according to an embodiment of the present invention. PBGA package 1100 includes plastic substrate 302, IC die 304, plurality of solder balls 306, plurality of wire bonds 308, die pad 310, one or more vias 314, one or more thermal/ground vias 316, epoxy 320, a ground/thermal connector 1102, epoxy 1104, a plurality of ground bonds 1106, and a plurality of ground bond pads 1108.

IC die 304 is mounted to die pad 310. Wire bonds 308 connect signals of IC die 304 to contact pads on substrate 302. The contact pads on substrate 302 connect to solder balls 306 attached to the bottom surface of substrate 302, through vias 314 and routing within substrate 302.

Thermal/ground vias 316 connect die pad 310 to an exposed metal plated plane 1110 at the bottom center of substrate 302. For instance, die pad 310 and metal plated plane 1110 may be exposed copper pads of plastic substrate 302.

Solder balls are not attached to the bottom region of substrate 302 covered by metal plated plane 1110. Ground/thermal connector 1102 is attached to metal plated plane 1110. For instance, ground/thermal connector 1102 may be a metal piece (copper or aluminum, for example) that is laminated to metal plated plane 1110 at the bottom center of substrate 302 using a conductive epoxy 1104. A bottom surface 1112 of ground/thermal connector 1102 may be plated with solder for surface mount to soldering pads on the PCB.

BGA package 1100 provides a thermal path of IC die 304, to die pad 310, to thermal/ground vias 316, to metal plated plane 1110, to epoxy 1104, to ground thermal connector 1102 (and bottom surface 1112) to the PCB soldering pads. Heat spreading is improved by a direct thermal path from IC die 304 to the PCB.

Metal pads on the PCB can be connected to a PCB ground plane to advantageously shorten the length of electrical current return paths, as well shorten the conductive heat dissipation path from device junctions of IC die to the PCB.

Ground bonds 1106 may be used to couple ground bond pads 1108 on IC die 304 to die pad 310, when die pad 310 is coupled to ground. This provides for very short ground connections for signals in IC die 304.

Figure 19A:
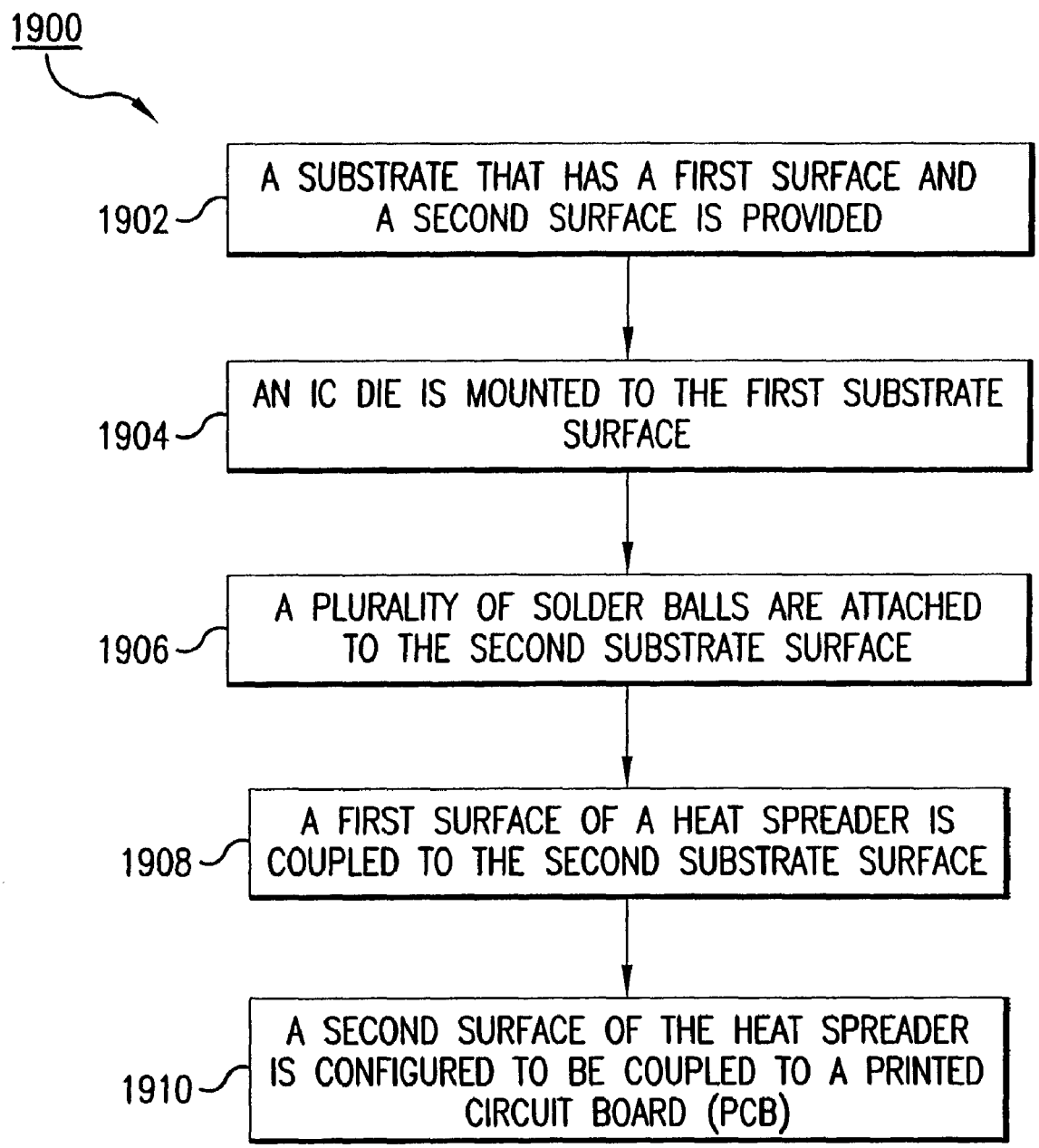
FIGS. 19A–C show flowcharts related to FIG. 11 that provide operational steps of exemplary embodiments of the present invention.
Figure 19B:
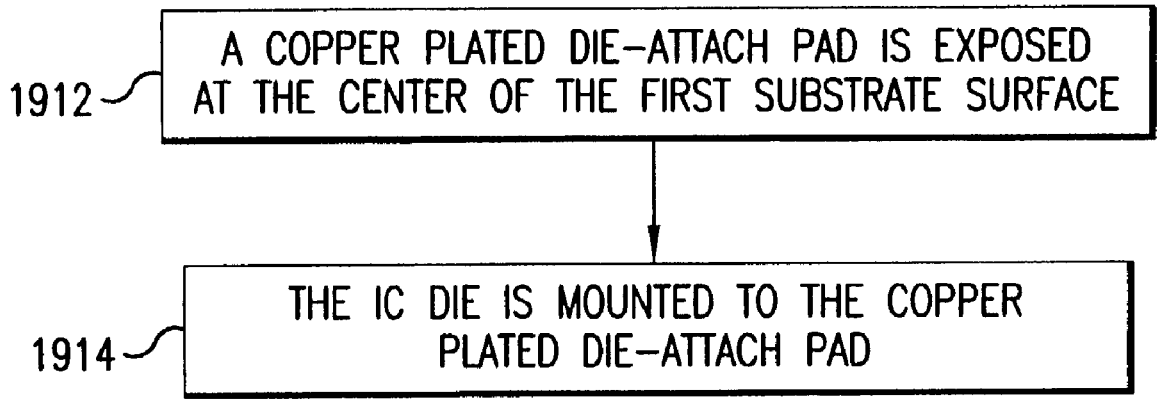
Figure 19C:
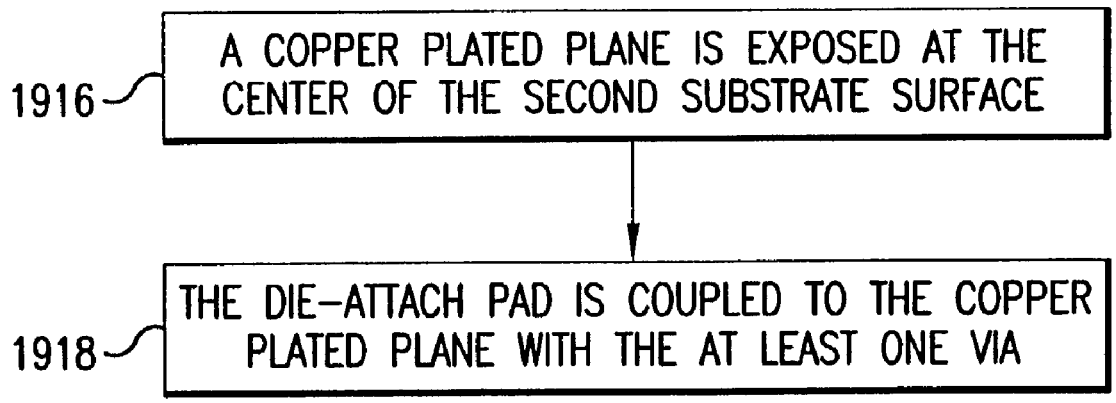

FIG. 19A shows a flowchart 1900 providing operational steps for assembling one or more embodiments of the present invention. FIGS. 19B–C provide operational steps according to further embodiments. The steps of FIGS. 19A–C do not necessarily have to occur in the order shown, as will be apparent to persons skilled in the relevant art(s) based on the teachings herein. Other structural embodiments will be apparent to persons skilled in the relevant art(s) based on the following discussion. These steps are described in detail below.

Flowchart 1900 begins with step 1902. In step 1902, a substrate that has a first surface and a second surface is provided. For example, the substrate is plastic substrate 302, or another substrate type suitable for a BGA package. For example, an IC die mounting position and contact points are provided on a first, upper surface, and solder ball pads are provided on a second, bottom surface.

In step 1904, an IC die is mounted to the first substrate surface. For example, the IC die is IC die 304, which is mounted to substrate 302. IC die 304 may be mounted to a die pad 310 attached to substrate 302.

In step 1906, a plurality of solder balls are attached to the second substrate surface. For example, the plurality of solder balls are plurality of solder balls 306, which connect to vias and/or solder ball pads on the bottom surface of substrate 302. The solder balls may be arranged on the bottom surface of substrate 302 as shown in FIG. 12B, or in other arrangements. The solder balls are used to attach a BGA package to a PCB.

In step 1908, a first surface of a heat spreader is coupled to the second substrate surface. For example, the heat spreader is ground/thermal connector 1102, which is coupled to substrate 302 with epoxy 1104. Ground/thermal connector 1102 may be mounted to metal plated plane 1110 on substrate 302 by epoxy 1104.

In step 1910, a second surface of the heat spreader is configured to be coupled to a printed circuit board (PCB). Second heat spreader surface is bottom surface 1112. In an embodiment, step 1910 may include the step where the second surface of the heat spreader is plated with solder.

Flowchart 1900 may comprise the additional step where the first substrate surface is coupled to the heat spreader through at least one via that extends through the substrate. For example, the first substrate surface may be coupled to the heat spreader by one or more ground/thermal vias 316.

FIG. 19B provides exemplary steps for performing step 1904:

In step 1912, a copper plated die-attach pad is exposed in the center of the first substrate surface. The copper plated die-attach pad, die pad 310, may be an exposed portion of a metal layer of plastic substrate 302.

In step 1914, the IC die is mounted to the copper plated die-attach pad. For example, the IC die may be mounted with an epoxy.

FIG. 19C provides exemplary steps for performing step 1908:

In step 1916, a copper plated plane is exposed in the center of the second substrate surface. The copper plated plane, metal plated plane 1110, is an exposed portion of a metal layer of plastic substrate 302.

In step 1918, the die-attach pad is coupled to the copper plated plane with the at least one via.

Flowchart 1900 may include the additional step where the first substrate surface is encapsulated. For instance, the first substrate surface may be encapsulated by a resin or molding compound, that also encapsulates the IC die and wire bonding.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A ball grid array (BGA) package, comprising:
   a substantially planar substrate having a plurality of contact pads on a first surface electrically connected through said substrate to a plurality of solder ball pads on a second surface of said substrate, wherein said substrate has an opening formed through said substrate that is open at said first and said second surfaces of said substrate;
   a metal stiffener having a first surface and a second surface, wherein said first surface of said stiffener is attached to said first surface of said substrate, wherein said stiffener has an opening through said stiffener that is open at said first and second surfaces of said stiffener;
   an integrated circuit (IC) die mounted to a central location of the second surface of said stiffener, wherein said IC die includes a bond pad;
   a wire bond that couples said bond pad to a contact pad on said first surface of said substrate through said opening in said stiffener; and
   a thermal connector attached to a portion of said first surface of said stiffener through said opening in said substrate, wherein a surface of said thermal connector is capable of being attached to a printed circuit board (PCB);
   wherein said stiffener is a heat spreader; and
   wherein said stiffener and said thermal connector provide a thermal path from said IC die to a PCB during operation of the IC die.

2. The package of claim 1, wherein said surface of said thermal connector is plated with solder.

3. The package of claim 1, further comprising:
   a second wire bond that couples a second bond pad of said IC die to said second surface of said stiffener.

4. The package of claim 1, further comprising:
   a thermally conductive adhesive layer that mounts said IC die to said second surface of said stiffener.

5. The package of claim 1, further comprising:
   a thermally conductive adhesive layer that attaches said thermal connector to said portion of said first surface of said stiffener.

6. The package of claim 1, further comprising:
   an electrically conductive adhesive layer that attaches said thermal connector to said portion of said first surface of said stiffener.

7. The package of claim 3, wherein said second bond pad is coupled to a ground potential signal in said IC die, whereby said stiffener and said thermal connector serve as a ground plane.

8. The package of claim 3, wherein said second bond pad is coupled to a power potential signal in said IC die, whereby said stiffener and said thermal connector serve as a power plane.

9. The package of claim 1, wherein said substrate is a tape substrate.

10. The package of claim 1, wherein said substrate is an organic substrate.

11. The package of claim 1, further comprising:
a plurality of solder balls attached to said plurality of solder ball pads.

12. The package of claim 1, wherein said thermal connector comprises at least one metal.

13. The package of claim 12, wherein said at least one metal includes copper.

14. The package of claim 12, wherein said at least one metal includes aluminum.

15. The package of claim 1, wherein said thermal connector is substantially planar.

16. A ball grid array (BGA) package, comprising:
a substantially planar substrate having a plurality of contact pads on a first surface electrically connected through said substrate to a plurality of solder ball pads on a second surface of said substrate, wherein said substrate has an opening formed through said substrate that is open at said first and said second surfaces of said substrate;
a metal stiffener that has a first surface and a second surface, wherein said first surface of said stiffener is attached to said first surface of said substrate, wherein said stiffener has an opening through said stiffener that is open at said first and second surfaces of said stiffener;
an integrated circuit (IC) die mounted to a central location of the second surface of said stiffener, wherein said IC die includes a bond pad;
a wire bond that couples said bond pad to a contact pad on said first surface of said substrate through said opening in said stiffener; and
a heat sink attached to a portion of said first surface of said stiffener through said opening in said substrate, wherein a surface of said heat sink is capable of being attached to a printed circuit board (PCB);
wherein said stiffener is a heat spreader; and
wherein said stiffener and said heat sink provide a thermal path from said IC die to a PCB during operation of the IC die.

17. The package of claim 16, wherein said surface of said heat sink is plated with solder.

18. The package of claim 16, further comprising:
a second wire bond that couples a second bond pad of said IC die to said second surface of said stiffener.

19. The package of claim 18, wherein said second bond pad is coupled to a ground potential signal in said IC die, whereby said stiffener and said heat sink serve as a ground plane.

20. The package of claim 18, wherein said second bond pad is coupled to a power potential signal in said IC die, whereby said stiffener and said heat sink serve as a power plane.

21. A ball grid array (BGA) package, comprising:
a substantially planar substrate having a plurality of contact pads on a first surface electrically connected through said substrate to a plurality of solder ball pads on a second surface of said substrate, wherein said substrate has an opening formed through said substrate that is open at said first and said second surfaces of said substrate;
a metal stiffener that has a first surface and a second surface, wherein said first surface of said stiffener is attached to said first surface of said substrate, wherein said stiffener has an opening through said stiffener that is open at said first and second surfaces of said stiffener;
an integrated circuit (IC) die mounted to a central location of the second surface of said stiffener, wherein said IC die includes a bond pad;
a wire bond that couples said bond pad to a contact pad on said first surface of said substrate through said opening in said stiffener; and
a first heat spreader attached to a portion of said first surface of said stiffener through said opening in said substrate, wherein a surface of said first heat spreader is capable of being attached to a printed circuit board (PCB);
wherein said stiffener is a heat spreader; and
wherein said stiffener and said first heat spreader provide a thermal path from said IC die to a PCB during operation of the IC die.

22. The package of claim 21, wherein said surface of said first heat spreader is plated with solder.

23. The package of claim 21, further comprising:
a second wire bond that couples a second bond pad of said IC die to said second surface of said stiffener.

24. The package of claim 23, wherein said second bond pad is coupled to a ground potential signal in said IC die, whereby said stiffener and said first heat spreader serve as a ground plane.

25. The package of claim 23, wherein said second bond pad is coupled to a power potential signal in said IC die, whereby said stiffener and said first heat spreader serve as a power plane.

* * * * *

UNITED STATES PATENT AND TRADEMARK OFFICE
CERTIFICATE OF CORRECTION

PATENT NO. : 7,102,225 B2  Page 1 of 1
APPLICATION NO. : 10/200336
DATED : September 5, 2006
INVENTOR(S) : Khan et al.

It is certified that error appears in the above-identified patent and that said Letters Patent is hereby corrected as shown below:

On the title page item (75), Brent Bacher should be removed from the list of inventors;

On the title page item (56), in the U.S. Patent Documents section, the following patents should be added: 6,011,694; 5,541,450; 6,545,351; 6,583,516; 6,563,712; and On the title page item (56), in the Foreign Patent Documents section, "JP 81-49446" should be replaced with -- JP 61-49446 --.

Signed and Sealed this

Twenty-third Day of September, 2008

JON W. DUDAS
*Director of the United States Patent and Trademark Office*